(12) United States Patent
Lee

(10) Patent No.: US 7,648,881 B2
(45) Date of Patent: Jan. 19, 2010

(54) NON-VOLATILE MEMORY DEVICES WITH CHARGE STORAGE INSULATORS AND METHODS OF FABRICATING SUCH DEVICES

(75) Inventor: Chang-Hyun Lee, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 572 days.

(21) Appl. No.: 11/428,884

(22) Filed: Jul. 6, 2006

(65) Prior Publication Data

US 2006/0240612 A1 Oct. 26, 2006

Related U.S. Application Data

(63) Continuation-in-part of application No. 11/272,638, filed on Nov. 14, 2005, now Pat. No. 7,495,284, which is a continuation-in-part of application No. 10/712,426, filed on Nov. 13, 2003, now Pat. No. 6,995,424.

(30) Foreign Application Priority Data

Jan. 10, 2003 (KR) ............................... 2003-01566

(51) Int. Cl.
*H01L 21/336* (2006.01)
*H01L 29/792* (2006.01)

(52) U.S. Cl. ................. 438/287; 438/296; 438/302; 438/306; 438/424; 257/324; 257/E29.309; 257/E21.423; 257/E21.545

(58) Field of Classification Search ................. 438/287, 438/279, 296, 302, 306; 257/324, E21.423, 257/E21.545

See application file for complete search history.

(56) References Cited

U.S. PATENT DOCUMENTS 5,188,976 A   2/1993   Kume et al. ................. 438/258

(Continued)

FOREIGN PATENT DOCUMENTS

KR   2002-0094505   12/2002

(Continued)

OTHER PUBLICATIONS

Notice to File a Response, Korean Application No. 10-2003-0001566, Nov. 29, 2004.

*Primary Examiner*—David Vu
*Assistant Examiner*—Earl N Taylor
(74) *Attorney, Agent, or Firm*—Myers Bigel Sibley & Sajovec

(57) ABSTRACT

A non-volatile memory device comprises a cell region defined at a substrate and a plurality of device isolation layers formed in the cell region to define a plurality of active regions. A charge storage insulator covers substantially the entire top surface of the cell region. A plurality of gate lines are formed on the charge storage insulator that cross over the device isolation layers. Conductive patterns are disposed between predetermined gate lines that penetrate the charge storage insulator to electrically connect with the active regions. According to the method of fabricating the device, a plurality of device isolation layers are formed in the substrate and then a charge storage insulator is formed on an entire surface of the substrate and the device isolation layers. A plurality of parallel gate lines that cross over the device isolation layers are formed on the charge storage insulator and then conductive patterns are formed between predetermined gate lines. The conductive patterns penetrate the charge storage insulator and electrically connect with the active regions.

51 Claims, 43 Drawing Sheets

U.S. PATENT DOCUMENTS

| | | | |
|---|---|---|---|
| 5,355,006 A * | 10/1994 | Iguchi | 257/296 |
| 6,306,690 B1 | 10/2001 | Kaya et al. | 438/136 |
| 6,440,798 B1 | 8/2002 | Lai et al. | 438/266 |
| 6,759,706 B2 | 7/2004 | Kobayashi | 257/314 |
| 6,781,193 B2 | 8/2004 | Lee et al. | 257/326 |
| 7,172,940 B1 * | 2/2007 | Chen et al. | 438/258 |
| 2002/0149081 A1 * | 10/2002 | Goda et al. | 257/510 |
| 2003/0030097 A1 * | 2/2003 | Lee et al. | 257/314 |
| 2003/0047755 A1 * | 3/2003 | Lee et al. | 257/200 |

FOREIGN PATENT DOCUMENTS

| | | |
|---|---|---|
| KR | 2003-0001088 | 1/2003 |

* cited by examiner

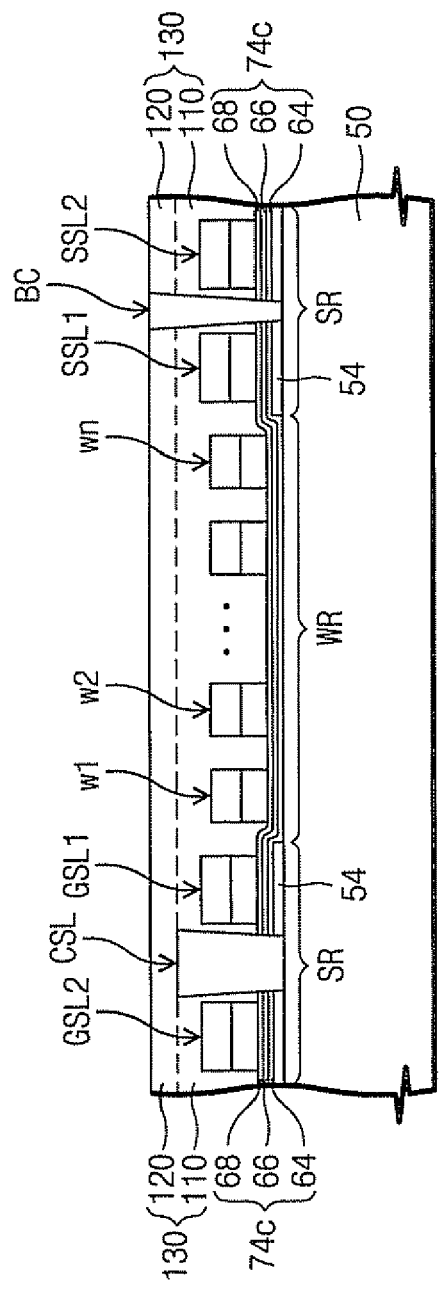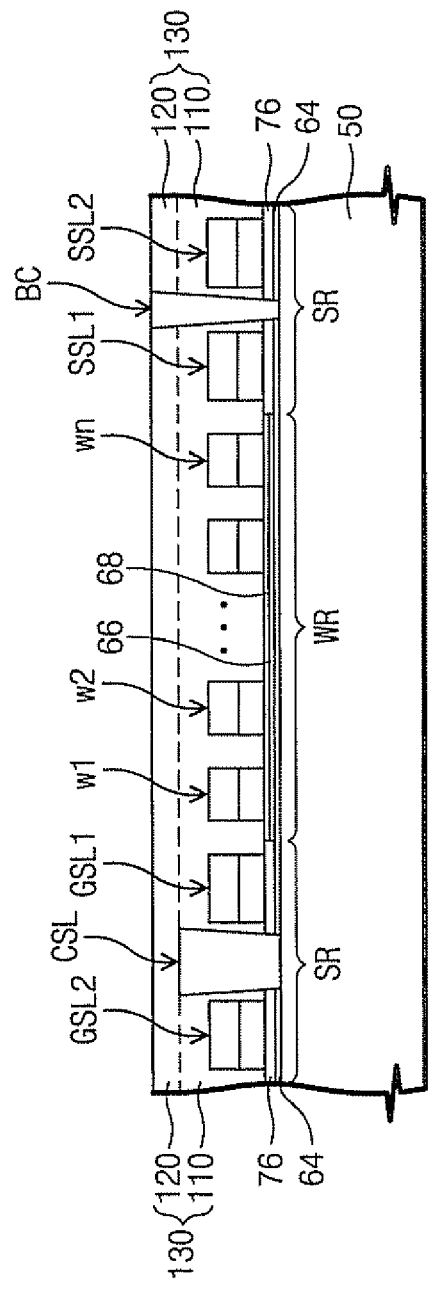

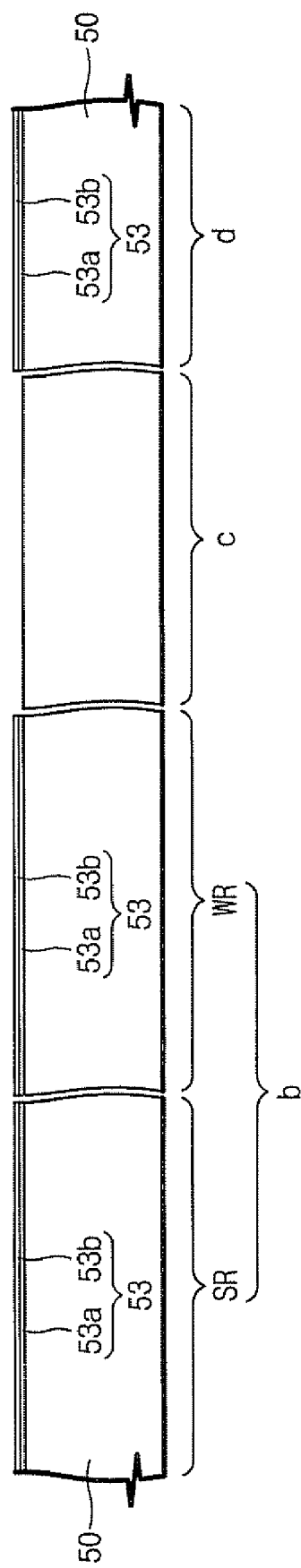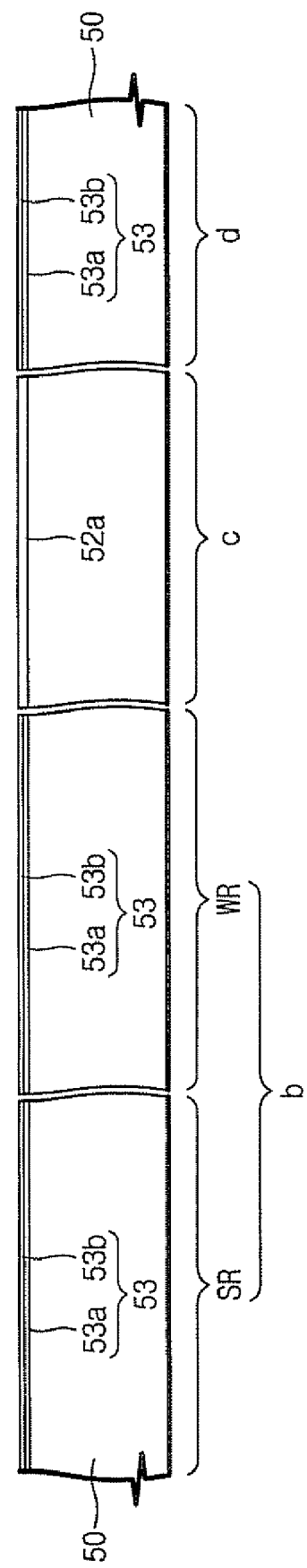

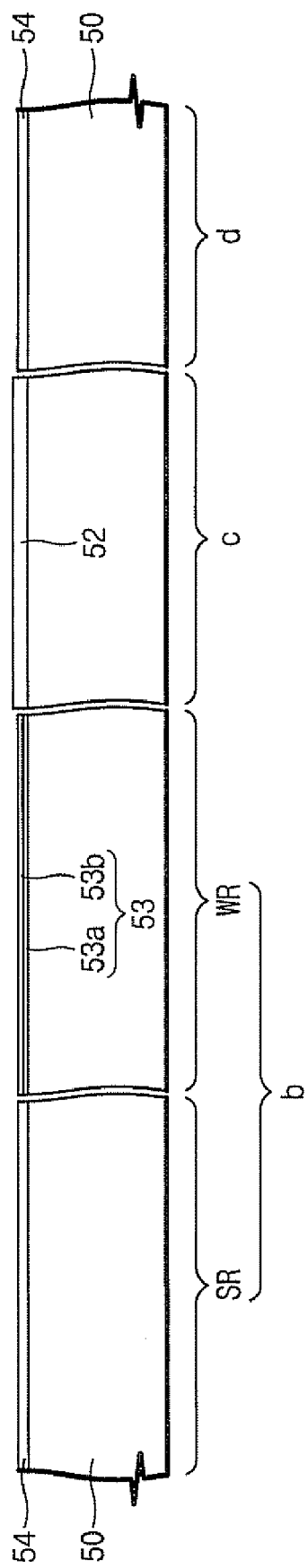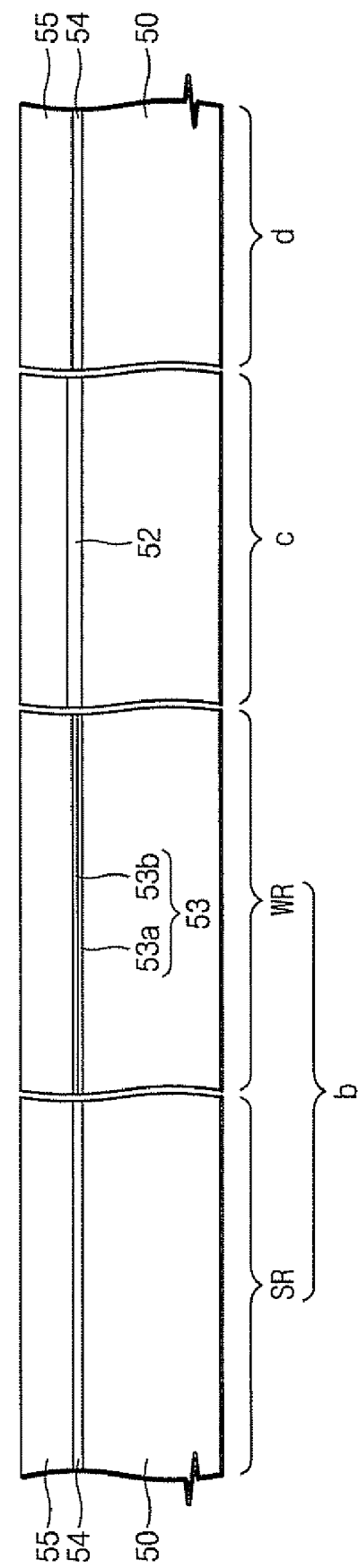

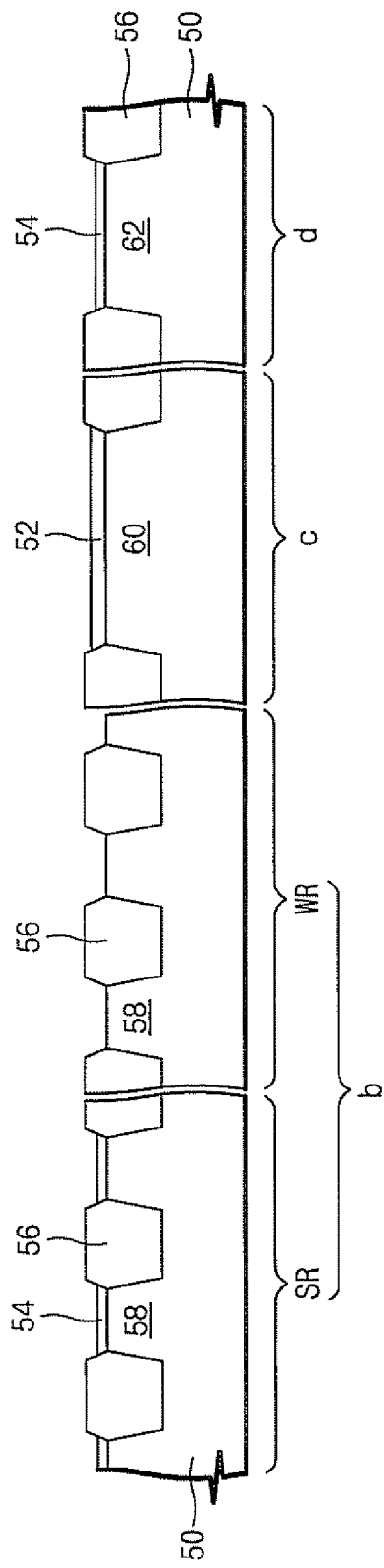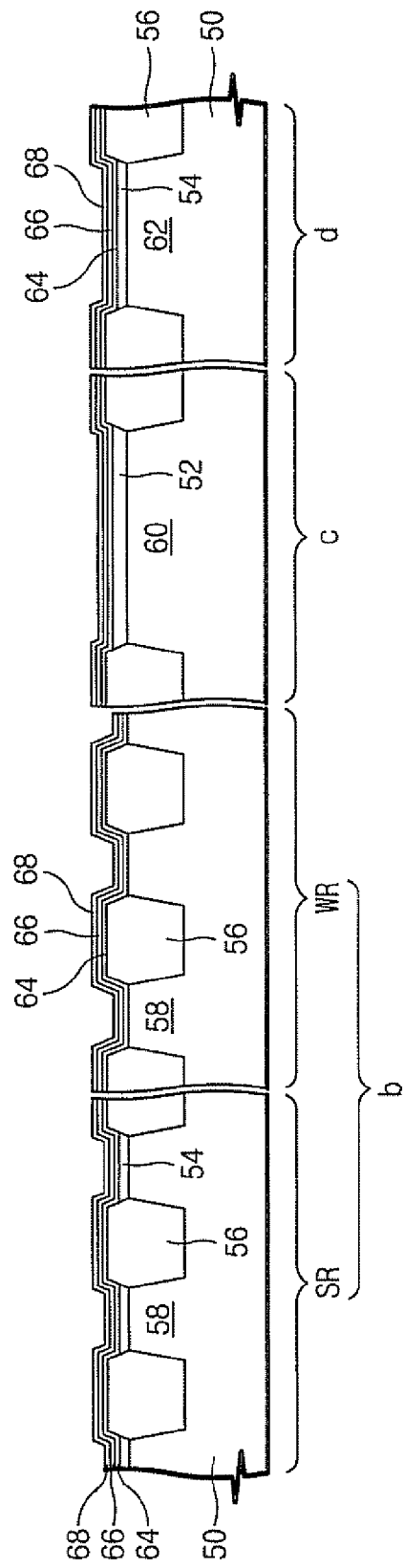

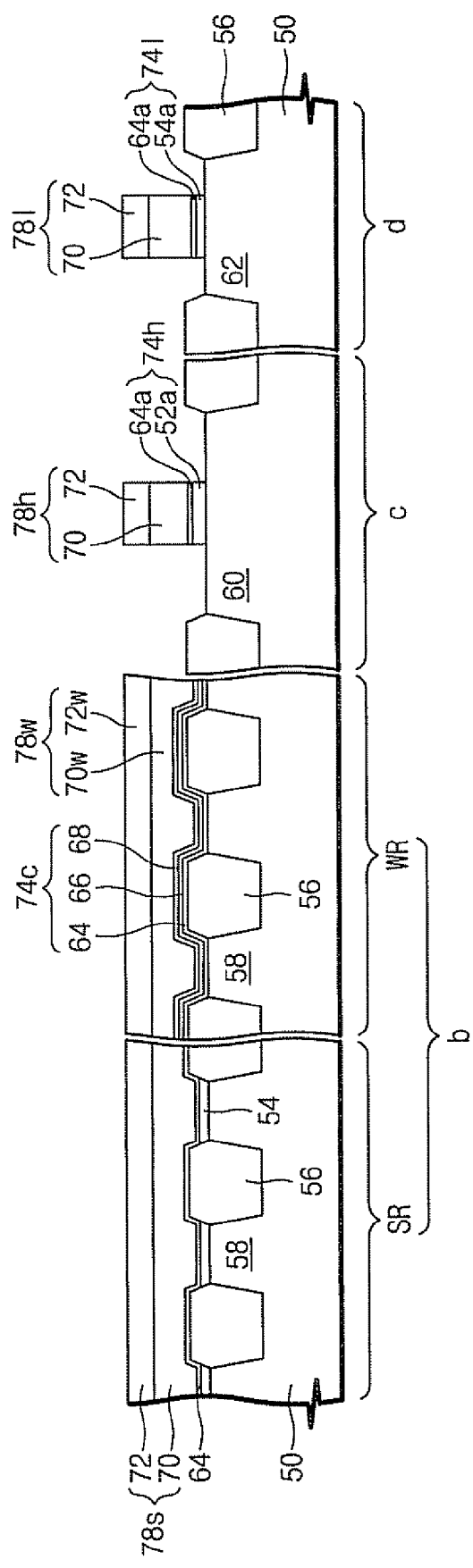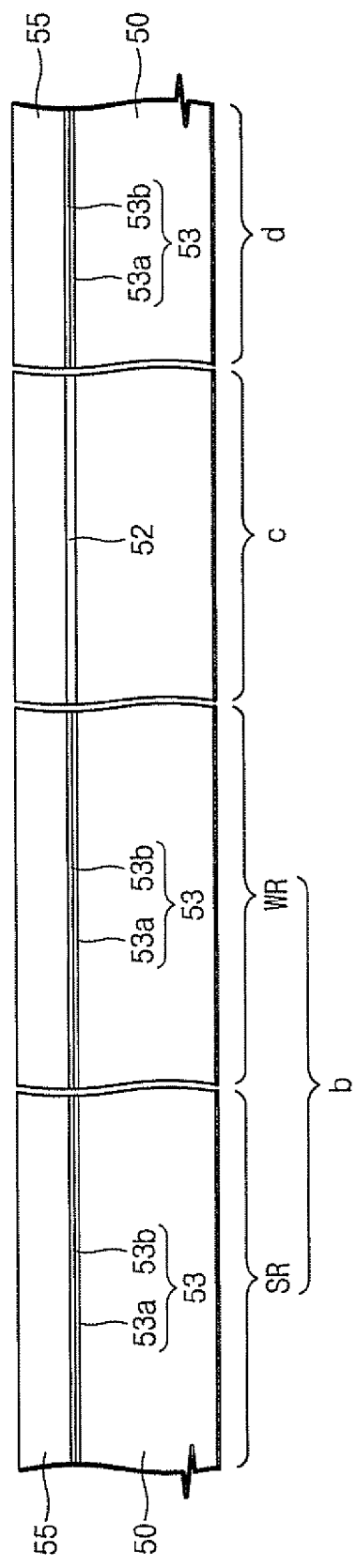

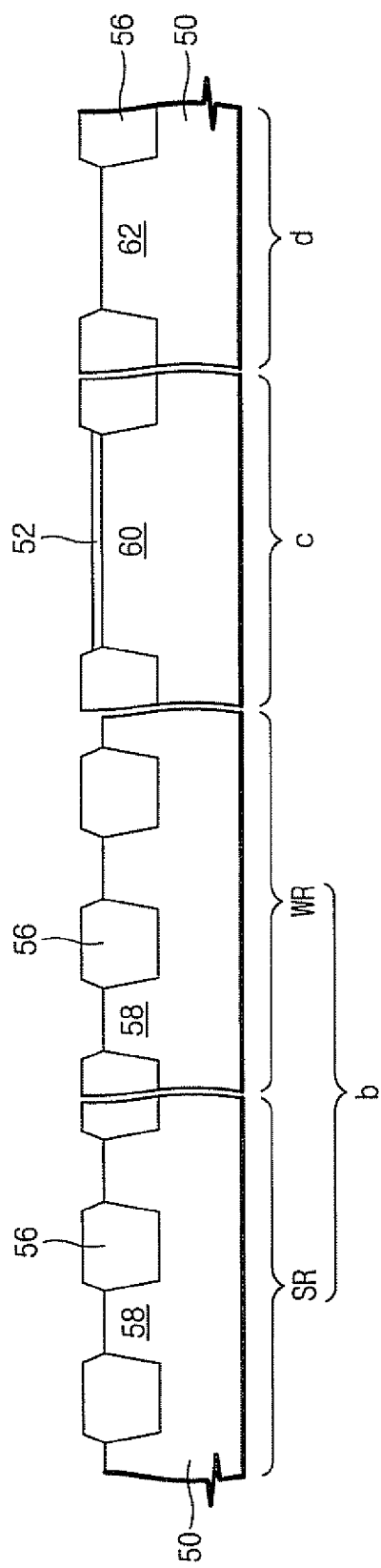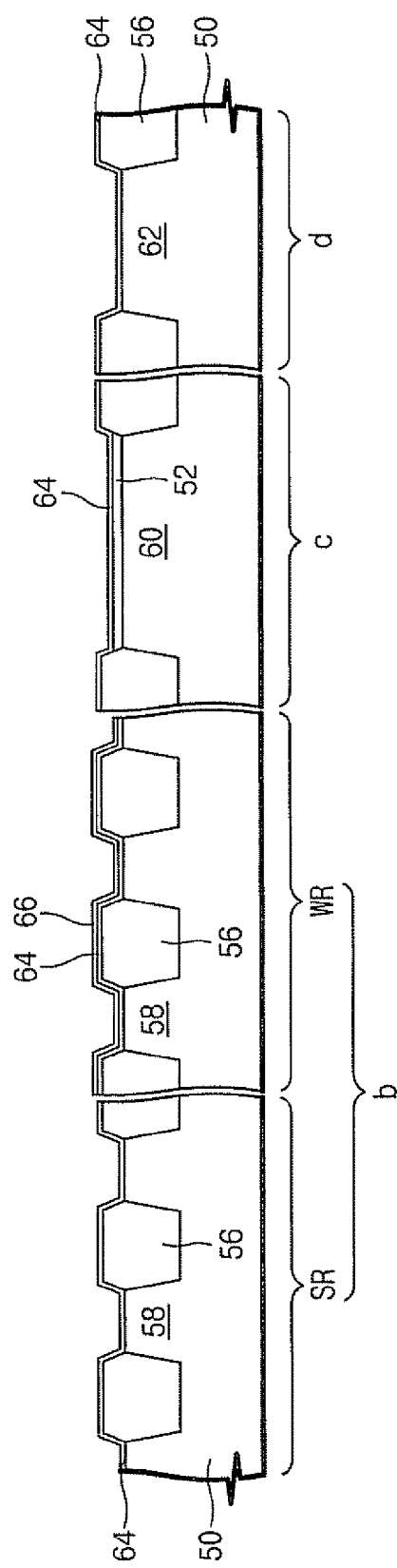

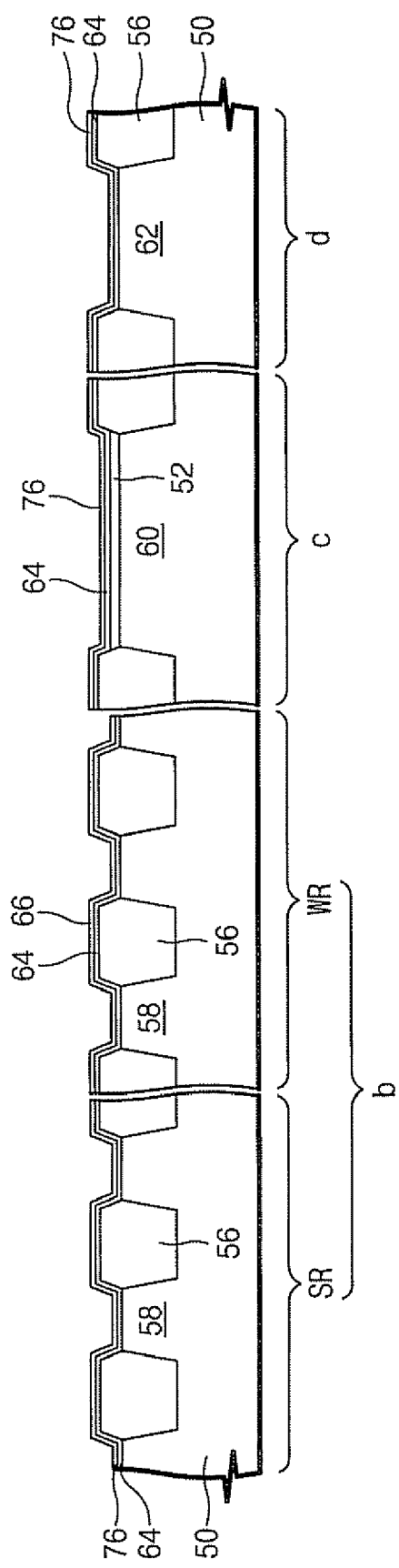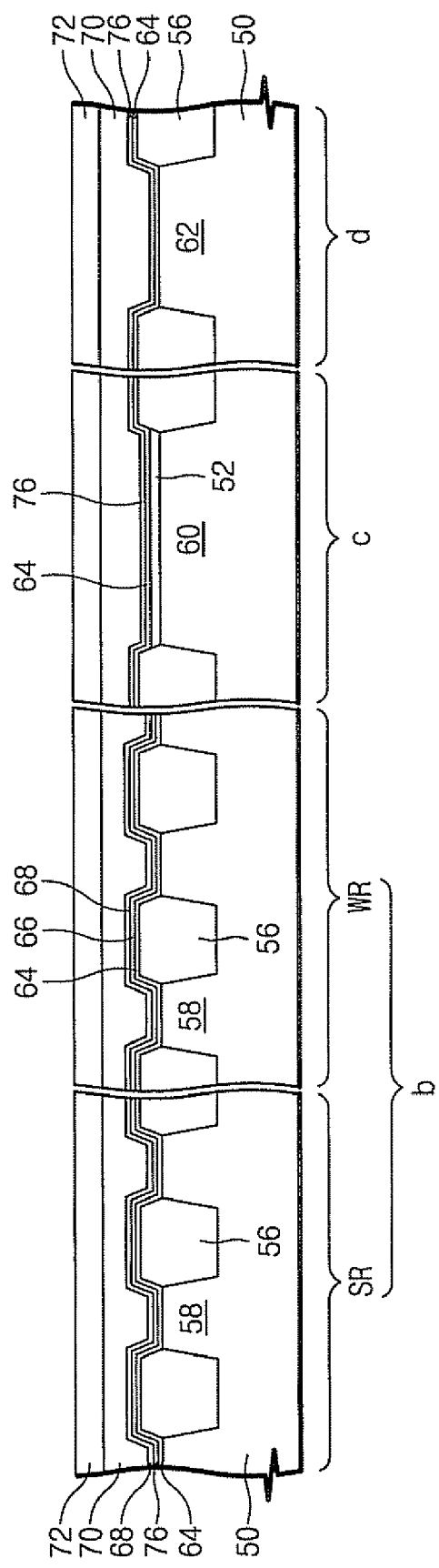

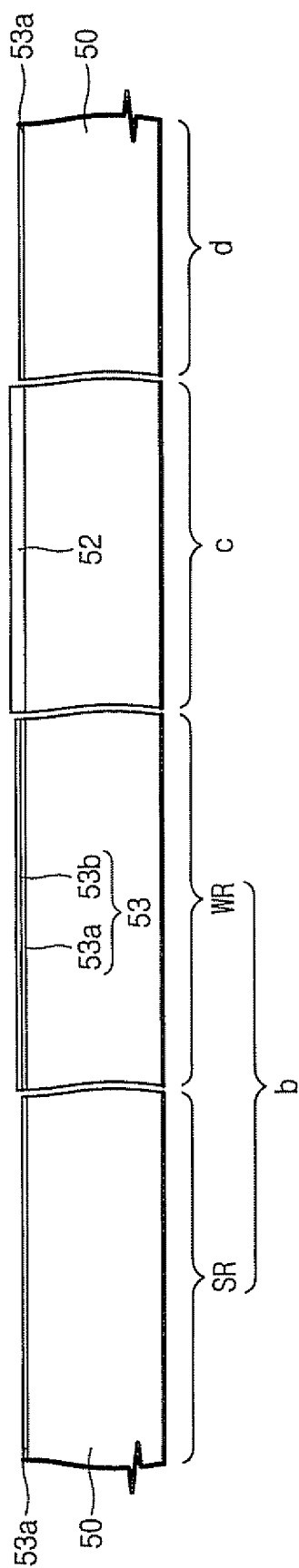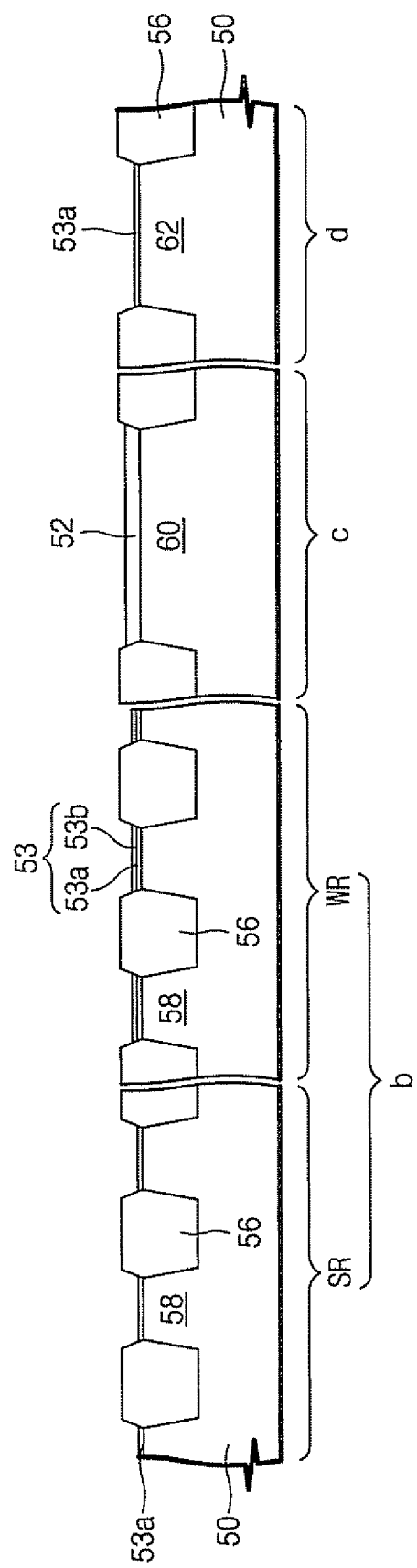

NON-VOLATILE MEMORY DEVICES WITH CHARGE STORAGE INSULATORS AND METHODS OF FABRICATING SUCH DEVICES

CLAIM OF PRIORITY

This application claims priority under 35 U.S.C. §120 as a continuation-in-part of U.S. patent application Ser. No. 11/272,638, filed Nov. 14, 2005 now U.S. Pat. No. 7,495,284, which claims priority as a continuation-in-part of U.S. patent application Ser. No. 10/712,426, filed Nov. 13, 2003 now U.S. Pat. No. 6,995,424, which claims priority under 35 U.S.C. §119 from Korean Patent Application No. 2003-01566 filed Jan. 10, 2003, in the Korean Intellectual Property Office. Accordingly, this application claims priority to each of the above-identified applications. The disclosures of each of the above applications are incorporated herein in their entirety by reference.

FIELD OF THE INVENTION

The present invention relates to memory devices and more specifically to non-volatile memory devices and methods for fabricating such devices.

BACKGROUND OF THE INVENTION

Non-volatile memory devices are memory devices that can store data when the power is cut off. Known types of non-volatile memory devices include flash memory devices, ferroelectric memory devices, phase changeable memory devices and magnetic memory devices.

Flash memory non-volatile memory devices include unit memory cells that have a structure similar to the structure of a MOS transistor. These devices do not require a separate data storage element and, as such, the cell region may be highly integrated. Generally speaking, a flash memory device may have one of two representative structures. The first such structure stores charge in a conductive floating gate, while the second representative structure stores the charge in a charge storage insulator. The flash memory devices that have the structure in which the charge is stored in a charge storage insulator may provide certain advantages, such as low program and erase voltages and excellent endurance and retention. In addition, multi-bit programmable versions of these devices can be fabricated.

FIGS. 1 through 5 depict a conventional flash memory non-volatile memory device that uses a charge storage insulator. As shown in the top plane view of the device provided in FIG. 1, the device includes a plurality of device isolation layers 28a that are formed on predetermined regions of a substrate 10 (the substrate is not shown in FIG. 1). An active region is defined between these device isolation layers 28a. A gate electrode 30 is disposed over the active region and the device isolation layers 28a. A charge trapping layer 16 is interposed between the gate electrode 30 and the active region.

FIGS. 2 through 5 are cross-sectional views taken along the line A-A of FIG. 1 illustrating various steps during the fabrication of the conventional non-volatile memory device depicted in FIG. 1. The conventional non-volatile memory device can be fabricated by forming a lower insulation layer 14, a charge trapping layer 16 and an upper insulation layer 18 on a substrate 10. A first conductive layer 20 and a hard mask layer 22 are formed on the upper insulation layer 18. The hard mask layer 22 and the first conductive layer 20 are patterned. Then, the upper insulation layer 18, the charge trapping layer 16, the lower insulation layer 14 and the substrate 10 are patterned to form the trench regions 12 that are depicted in FIG. 2.

A thermal process is then applied to the substrate 10 with the trench regions 12 to form a trench oxide layer 24 on the inner sides of the trench regions 12 (see FIG. 3). Then, an insulation layer 28 is formed on the trench oxide layer 24 to fill the trench regions 12. Generally, the substrate 10 and the first conductive layer 20 are formed of silicon. As a result, both the portion of the substrate 10 that contacts the lower insulation layer 14 mid the portion of the first conductive layer 20 that contacts the upper insulation layer 18 may be partially etched (see reference numeral 26 on FIG. 3). Moreover, when silicon is thermally oxidized it expands such that it approximately doubles in volume. The tensile stress and compressive stress that results from the oxidation of the silicon substrate 10 and the first conductive silicon layer 20 may act to deteriorate the charge trapping layer 16. In addition, etch damage may occur during the formation of the trench regions 12 that leaves defects at one or both edges of the charge trapping layer 16 where the charge trapping layer 16 is aligned to the sidewalls of the trench regions 12.

As shown in FIG. 4, a chemical-mechanical polishing process may then be applied to the insulation layer 28. The insulation layer 28 is first polished until the hard mask layer 22 is exposed and the insulation layer 28 is divided into device isolation layers 28a that fill the trench regions 12. Then, the hard mask layer 22 is removed to expose the first conductive layer 20.

As shown in FIG. 5, a polysilicon layer 30 and a silicide layer 32 are then formed over the entire surface of the substrate. The polysilicon layer 30, the silicide layer 32 and the first conductive layer 20 are patterned to form a gate electrode 34 that crosses over the device isolation layers 28a. As discussed above, the conventional non-volatile memory device illustrated in FIG. 5 can have defects at the regions neighboring the device isolation layers 28a. These defects can deteriorate the data storage and endurance characteristics of the device.

SUMMARY OF THE INVENTION

Pursuant to embodiments of the present invention, non-volatile memory devices are provided that comprise a substrate on which a plurality of device isolation layers are formed that define a plurality of active regions. These devices further include a charge storage insulator that is formed on the plurality of active regions and the plurality of device isolation layers, as well as a plurality of word lines formed on the charge storage insulator crossing over the active regions. A plurality of conductive patterns may be disposed between the word lines that penetrate the charge storage insulator to electrically connect with the active region.

The charge storage insulator may comprise a lower oxide layer, a charge trapping layer and an upper oxide layer. The upper oxide layer may be an insulative metal oxide layer. The plurality of device isolation layers and the plurality of active regions may be located in a cell region of the device, and the charge storage insulator may be formed on substantially the entire surface of the cell region.

In additional embodiments of the present invention, the plurality of device isolation layers formed in the substrate may also define a plurality of second active regions in a high voltage region of the device and a plurality of third active regions in a low voltage region of the device. A high voltage gate pattern crosses over the second active region and a low voltage gate pattern crosses over the third active region. An insulation layer may also be interposed between the high voltage gate electrode and the second active region, and an insulation layer may be interposed between the low voltage gate electrode and the third active region. These insulation layers may comprise single layer, double layer and/or triple layer insulation layers. The top surface of the device isolation layers may be disposed higher than the top surface of the active regions.

The high voltage gate electrode and the low voltage gate electrode may comprise a lower gate pattern that is formed between a pair of device isolation layers and an upper gate pattern. The upper gate pattern may be formed on the lower gate pattern and may overlap a portion of the device isolation layers.

Methods of fabricating non-volatile memory devices are also disclosed. In embodiments of these methods, the device is fabricated by forming a plurality of device isolation layers in the cell region of a substrate to define a plurality of active regions, and then forming a charge storage insulator on the active regions and the device isolation layers. A plurality of gate lines may then be formed on the charge storage insulator, and conductive patterns may also be formed that penetrate the charge storage insulator between some of the plurality of gate lines to electrically connect with the active region. Trenches in which the device isolation layers are formed may be fabricated by forming a pad insulation layer and a hard mask layer on the substrate and then patterning the hard mask layer, the pad insulation layer and the substrate to form the trenches. Then an insulation layer may be formed over substantially the entire surface of the cell region, and this insulation layer may be polished down to the hard mask layer via polishing so as to divide the insulation layer into a plurality of device isolation layers.

According to further embodiments of the present invention, non-volatile memory devices are provided that include a substrate having a plurality of device isolation layers and a plurality of active regions between the device isolation layers. A charge storage insulation layer is on the plurality of active regions and the plurality of device isolation layers. The charge storage insulation layer includes a lower insulation layer, a charge storage layer on the lower insulation layer, and an upper insulation layer on the charge storage layer. A plurality of spaced apart gate lines are on the charge storage insulation layer, and these gate lines define a plurality of regions between the gate lines. In these devices, the lower insulation layer and the charge storage layer cover the plurality of active regions and the plurality of device isolation layers in the plurality of regions between the gate lines. In certain embodiments of the present invention, the charge storage layer may be an insulation layer, a silicon-rich oxide, or an insulation layer that includes conductive dots. The conductive dots, if included, may comprise a semiconductor or a metal. The upper insulation layer may also cover the plurality of active regions and the plurality of device isolation layers in the plurality of regions between the gate lines. In some embodiments, the thickness of the upper insulation layer in the regions between the gate lines may be smaller than the thickness of the upper insulation layer in the regions below the gate lines.

The upper insulation layer may comprise at least one metal oxide layer such as, for example, an oxide of metal listed in Group III or VB of the Periodic Table. The metal in the metal oxide layer may be doped, for example, with at least one element listed in Group IV of the Periodic Table. In specific embodiments, the metal oxide layer may comprise $Al_2O_3$, $HfO_2$, HfAlO, HfAlON, $ZrO_2$, ZrAlO, HfSiO, and/or HfSiON. In addition, a protective insulation layer may be provided between the at least one metal oxide layer and the gate lines.

Pursuant to still further embodiments of the present invention, non-volatile memory devices are provided that comprise a substrate including a plurality of device isolation layers and a plurality of active regions between the device isolation layers. A charge storage insulation layer is provided that covers the plurality of device isolation layers and the plurality of active regions. A plurality of spaced apart gate lines that define a plurality of regions between the gate lines are provided, wherein a first subset of the regions between the gate lines have a first width and a second subset of the regions between the gate lines have a second width that is greater than the first width. The devices may also include spacer insulation layers on sidewalls of the gate lines that extend into respective regions between the gate lines, as well as a plurality of interconnection patterns that are provided in respective ones of the second subset of the regions between the gate lines that electrically connect to the substrate. In these devices, each spacer insulation layer that extends into the first subset of the regions between the gate lines connects with another of the spacer insulation layers, while the spacer insulation layers that extend into the second subset of the regions between the gate lines are spaced apart from each other.

Pursuant to additional embodiments of the present invention, non-volatile memory devices are provided that comprise a substrate having a plurality of device isolation layers that define a plurality of active regions. In these devices, a charge storage insulation layer is provided on the plurality of device isolation layers and the plurality of active regions. A plurality of spaced apart gate lines (wherein each gate line is a word line, a ground select line or a string select line) are on the charge storage insulator. Sidewall spacers are provided on sidewalls of the gate lines. Each sidewall spacer that is on a word line connects with the sidewall spacer on an adjacent gate line.

Pursuant to other embodiments of the present invention, methods of fabricating non-volatile memory devices are provided in which a plurality of device isolation layers are formed in the substrate to define a plurality of first active regions in a cell region of the device, and a plurality of second active regions in a peripheral region of the device. A charge storage insulation layer is formed on at least the first active regions. A plurality of gate lines are formed on the charge storage insulation layer. A plurality of gate electrodes are formed over the second active regions. A first ion implantation process is carried out in the cell region. A second ion implantation process is carried out in the cell region and the peripheral region. Source/drain regions are formed in the cell region and the peripheral region by carrying out the first and the second ion implantation process.

In these embodiments, the methods may further comprise forming an ion implantation mask on the substrate that exposes at least portions of the cell region and covers the peripheral region before carrying out the first ion implantation process, and removing the ion implantation mask after carrying out the first ion implantation process and before carrying out the second ion implantation process. In these embodiments, the first ion implantation process may comprise a tilt ion implantation process. The first ion implantation process may further comprise a non-tilt ion implantation process. The non-tilt ion implantation process may be carried out prior to the tilt ion implantation process. Where an interval between the gate lines is L1, and a height of the gate lines from the charge storage insulation layer is L2, impurity ions may be injected at an incident angle θ defined by $\theta \leq \tan^{-1}(L1/L2)$.

Pursuant to still further embodiments of the present invention, methods of fabricating non-volatile memory devices are provided in which a plurality of active regions are defined in a substrate. A plurality of gate lines are formed crossing over the active regions. A first ion implantation process is carried out to form source/drain regions in the active regions. The first ion implantation process comprises a tilt ion implantation process.

In these embodiments, the methods may further comprise forming a charge storage insulation layer on at least the active regions. The first ion implantation process may further comprise a non-tilt ion implantation process. The non-tilt ion implantation may be carried out prior to the tilt ion implantation. The impurity ions may be injected at an incident angle θ defined by $\theta \leq \tan^{-1}(L1/L2)$, where L1 is the interval between adjacent gate lines and L2 is a height of the gate lines from the substrate.

BRIEF DESCRIPTION OF THE DRAWINGS

FIG. 7A is a cross-sectional view, taken along the line B-B, of certain of the embodiments of the non-volatile memory devices depicted in FIG. 6.

FIG. 7B is a cross-sectional view, taken along the line B-B, showing other embodiments of the non-volatile memory devices depicted in FIG. 6.

FIGS. 13 through 20 are cross-sectional views illustrating steps of fabricating non-volatile memory devices according to embodiments of the present invention.

FIGS. 21 through 26 are cross-sectional views illustrating steps of fabricating non-volatile memory devices according to additional embodiments of the present invention.

FIGS. 27 through 32 are cross-sectional views illustrating steps of fabricating non-volatile memory devices according to further embodiments of the present invention.

FIGS. 43A-47A and FIGS. 43B-47B are cross-sectional views of a wordline region, each being taken along a line B-B of FIG. 6, illustrating modified versions of embodiments of the present invention, respectively.

DETAILED DESCRIPTION

Figure 1:
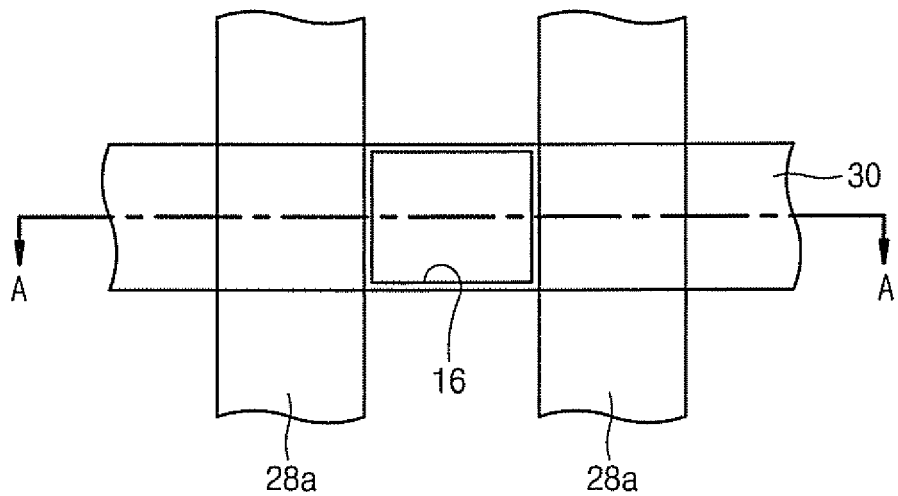
FIG. 1 is a top plane view of a non-volatile memory device that includes a conventional charge storage insulator.
Figure 2:
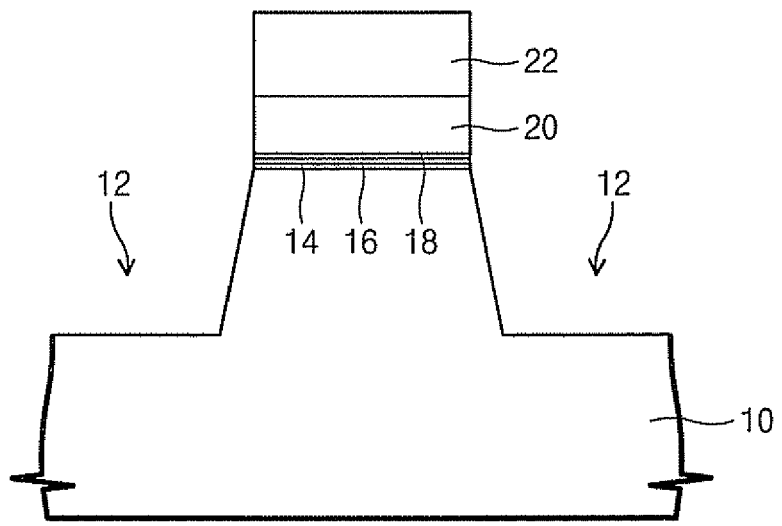
FIGS. 2 through 5 are process cross-sectional views taken along a ling A-A of FIG. 1 that illustrate a method of manufacturing a conventional non-volatile memory device depicted in FIG. 1.
Figure 3:
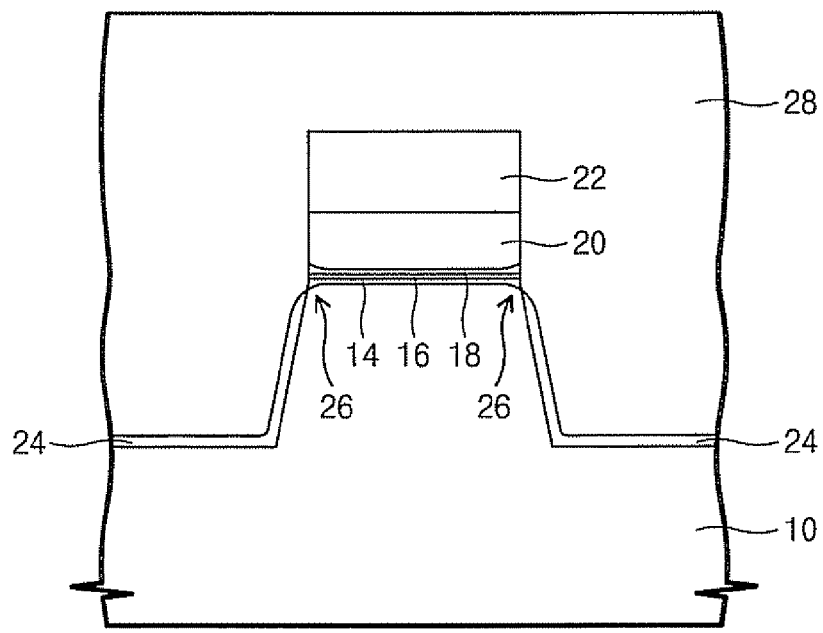
Figure 4:
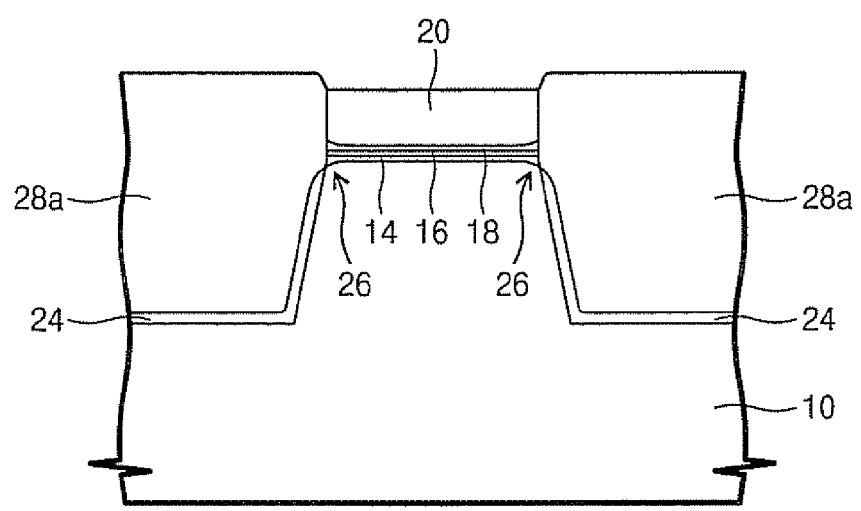
Figure 5:
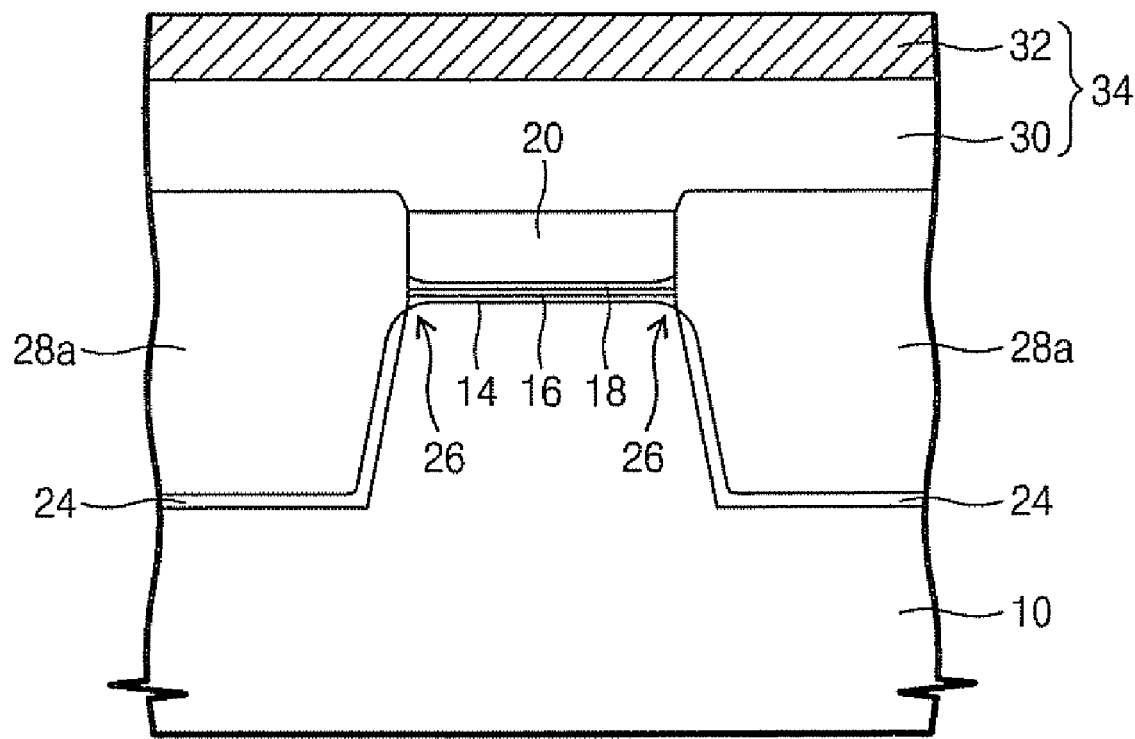

Embodiments of the present invention will now be described more fully with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like reference numerals refer to like elements throughout this application.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (i.e., "between" versus "directly between", "adjacent" versus "directly adjacent", etc.).

Relative terms such as "below" or "above" or "upper" or "lower" or "horizontal" or "vertical" may be used herein to describe a relationship of one element, layer or region to another element, layer or region as illustrated in the figures. It will be understood that these terms are intended to encompass different orientations of the device in addition to the orientation depicted in the figures.

It also will be understood that, as used herein, the terms "row" and "column" indicate two non-parallel directions that may be orthogonal to one another. However, the terms row and column do not indicate a particular horizontal or vertical orientation.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this disclosure and the relevant art and will not be interpreted in an idealized or overly formal sense unless expressly so defined herein.

Figure 6:
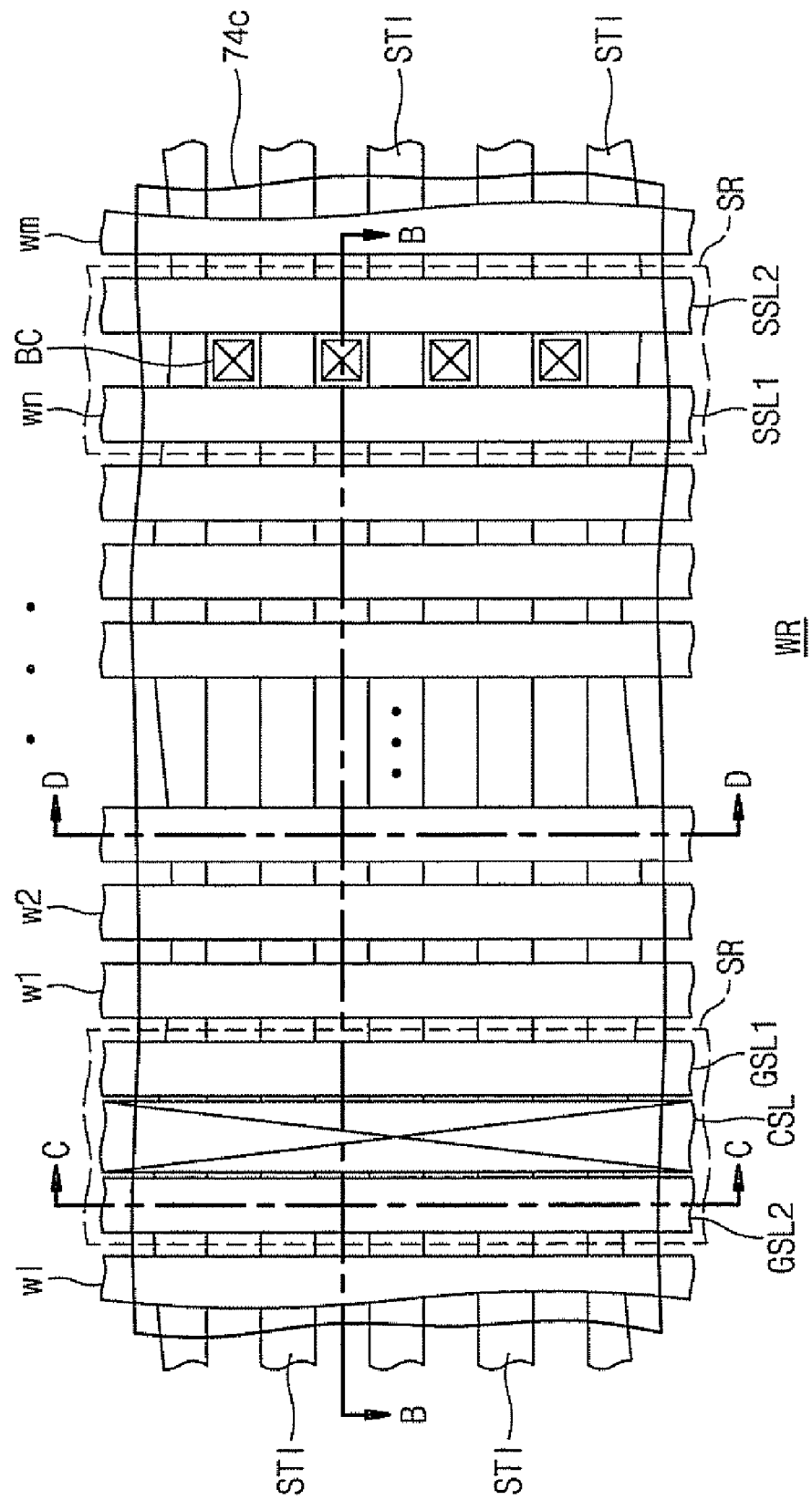
FIG. 6 is top plane view showing a cell region of non-volatile memory devices in accordance with embodiments of the present invention.

FIG. 6 is a top plane view illustrating the cell region of non-volatile memory devices according to embodiments of the present invention. As shown in FIG. 6, the cell region of the non-volatile memory device has selection gate regions SR and a word line region WR. The selection gate regions SR are disposed on a substrate and the word line regions WR are defined between the selection gate regions SR. Device isolation layers STI are formed on the substrate, and a charge store layer 74c covers the entire surface of the cell region. As shown in FIG. 6, the charge storage layer 74c may be conformally formed both on the active regions and on the device isolation layers STI that neighbor the active regions.

As is further illustrated in FIG. 6, a plurality of parallel gate lines GSL, SSL, w1~wn may be disposed on the charge storage layer 74c. The gate lines cross over the device isolation layers STI. The gate lines may comprise a plurality of word lines w1~wn, ground selection lines GSL and string selection lines SSL. The plurality of word lines w1~wn are disposed in the word line region WR, and the ground selection lines GSL and string selection lines SSL are disposed in the selection gate regions SR. A selection gate region SR may be provided on both sides of the word line region WR. In a NAND type cell array, the two ground selection lines GSL are formed opposite to each other and a common source line CSL is disposed between the ground selection lines GSL. In a NAND type cell array the two string selection lines SSL are disposed opposite to each other and a plurality of bit line plugs BC are disposed between the string selection lines SSL. The common source line CSL is disposed parallel to the word lines wn and is electrically connected to the active regions that are provided between the device isolation layers STI. The bit line plugs BC are also disposed parallel to the word lines wn and are also electrically connected to the active regions that are provided between the device isolation layers STI. Thus, as illustrated in FIG. 6, the charge storage insulation layer 74c may cover substantially the entire surface of the cell region (although, as noted above, the charge storage insulation layer 74c may have openings that expose the device isolation layer STI and the active region in the vicinity of the common source line CSL and the bit line plugs BC). Alternately, the charge storage insulator 74c may be formed only under the gate lines so that it does not cover the entire surface of the cell region.

Figure 8:
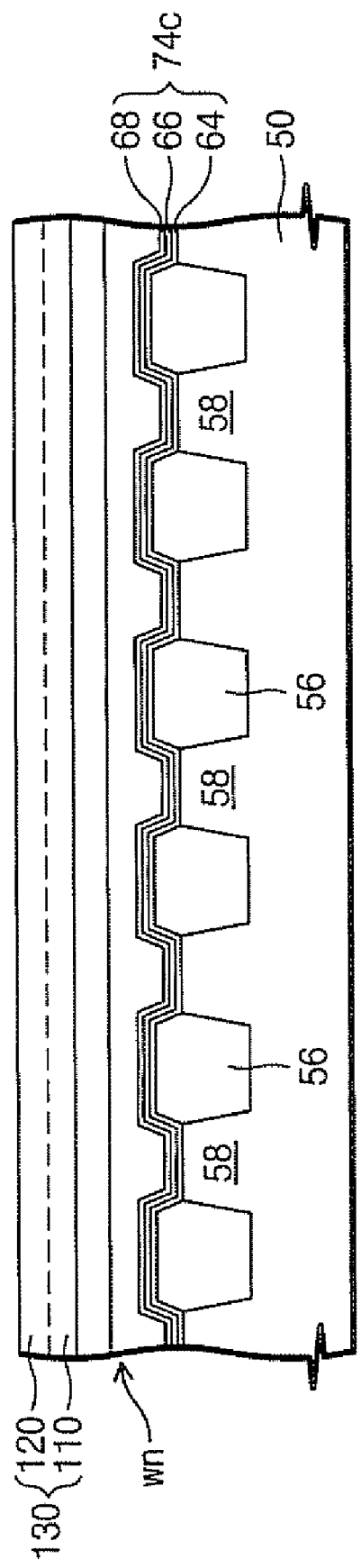
FIG. 8 is a cross-sectional view, taken along the line C-C, of the non-volatile memory device depicted in FIG. 6.

FIG. 7A is a cross-sectional view, taken along a line B-B, of the non-volatile memory device depicted in FIG. 6. FIG. 8 is a cross-sectional view, taken along the line D-D, of the non-volatile memory device depicted in FIG. 6. As shown best in FIG. 8, the cell region of the non-volatile memory device may include a plurality of parallel device isolation layers 56 that are formed in trenches provided in the substrate 50. The device isolation layers 56 define a plurality of active regions 58. Turning to FIG. 7A it is seen that the cell region comprises a word line region WR where word lines w1~wn are disposed and selection gate regions SR where selection gate lines SSLn and GSLn are disposed. A charge storage insulator 74c is formed on the substrate over the device isolation layers 56 and the active regions 58. The charge storage insulator 74c comprises a lower oxide layer 64, a charge trapping layer 66 and an upper oxide layer 68. The gate lines referenced above may be formed on the charge storage insulator 74c.

In a NAND type cell array, the gate insulation layer of the selection transistor may be thicker than that of the memory cell in order to reduce the possibility that the selection transistors are softly programmed. Thus, the memory device of the present invention may further include an oxide layer 54 that is interposed between the substrate 50 and the charge storage insulator 74c.

FIG. 7B depicts an alternative embodiment of the non-volatile memory devices of the present invention. As shown in FIG. 7B, in this alternative structure the charge trap layer 66 and the upper oxide layer 68 may be formed only in the word line region WR. In contrast to the device depicted in FIG. 7A, in the selection gate region the device of FIG. 7B may omit both the charge trap layer 66 and the upper oxide layer 68. As is also shown in FIG. 7B, an oxide layer 76 may be formed on the lower oxide layer 64.

As is best seen in FIG. 8, the top surface of the device isolation layers 56 may be formed so that they are higher than the top surface of the active regions. According to additional aspects of the present invention, the sidewalls of the device isolation layers 56 adjacent the active regions may have a predetermined angle of inclination or curvature.

As best seen in FIGS. 7A and 7B, the gate lines may comprise ground selection lines GSL and string selection lines SSL and a plurality of word lines w1~wn. The gate lines cross over the device isolation layers 56 and may be disposed so they are parallel to each other. The ground selection lines GSL and the string selection lines SSL are located in the selection gate regions SR, and the word lines w1~wn are located in the word line region WR. Additionally, a conductive pattern is disposed between the ground selection lines GSL1 and GSL2 that is parallel to the word lines w1~wn. This conductive pattern corresponds to a common source line CSL. A plurality of conductive patterns may also be disposed between the string selection lines SSL1 and SSL2, and these conductive patterns may correspond to a bit line plug BC.

As shown best in FIGS. 7A and 7B, the common source line CSL is formed in an interlayer dielectric layer 130. As shown in FIG. 7A, the common source line CSL extends through charge storage insulator 74c and the oxide layer 54 to electrically connect to the active regions 58. Alternatively, as shown in FIG. 7B, the common source line CSL extends through lower oxide layer 64 and oxide layer 76 to electrically connect to the active regions 58. The common source line CSL may be formed as follows. A first interlayer insulation layer 110 can be formed. Then, the first interlayer insulation layer 110, the charge storage insulator 74c and the oxide layer 54 can be patterned to form a groove. Alternatively, the interlayer insulation layer 110, the lower oxide layer 64 and the oxide layer 76 can be patterned to form a groove. The groove can then be filled with a conductive layer to form the common source line CSL.

The bit line plugs BC are likewise formed in the interlayer dielectric layer 130. As shown in FIG. 7A, the bit line plugs BC extend through the charge storage insulator 74c and the oxide layer 54 to electrically connect to the active regions 58. Alternatively, as shown in FIG. 7B, the bit line plugs BC extend through lower oxide layer 64 and oxide layer 76 to electrically connect to the active regions 58. These bit line plugs BC can be formed in the following steps. When the first interlayer insulation layer 110 is formed as described above, the layer 10 covers the area where the bit line plugs will be disposed. Then, a second interlayer insulation layer 120 is formed on the first interlayer insulation layer 110. The first and second interlayer insulation layers 10 and 120 and the charge storage insulator 74c may then be patterned to form a plurality of contact holes (see FIGS. 7A and 6). Alternatively, the first and second interlayer insulation layers 110 and 120, the lower oxide layer 64 and the oxide layer 76 may then be patterned to form a plurality of contact holes (see FIGS. 7B and 6). The contact holes expose the active region. These contact holes may then be filled with conductive material to form the bit line plugs BC. Note that the upper oxide layer 68 that is part of the charge store insulation layer 74c may be an insulation metal oxide such as, for example, aluminum oxide. Such an insulation metal oxide may be selectively etched with respect to silicon oxide so that the insulation metal oxide may be used as an etch stop layer during etching, of the first interlayer dielectric layer in order to form the groove (that is used to form the common source line CSL) or the contact holes (that are use to form the bit line plugs BC).

Figure 9:
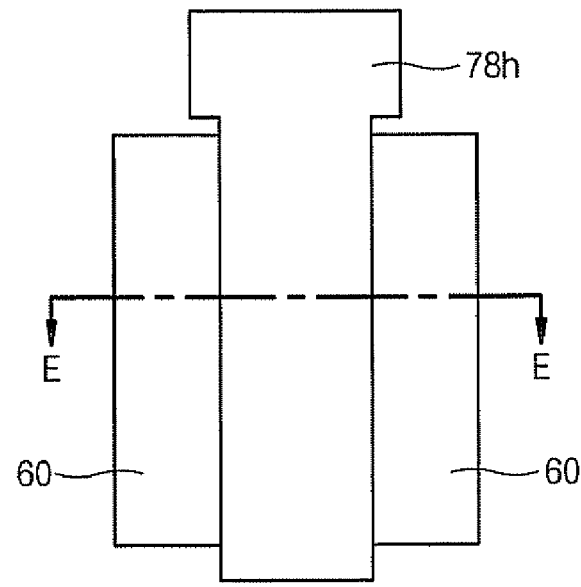
FIG. 9 is a top plane view of the high voltage region of a nonvolatile memory devices in accordance with embodiments of the present invention.
Figure 10:
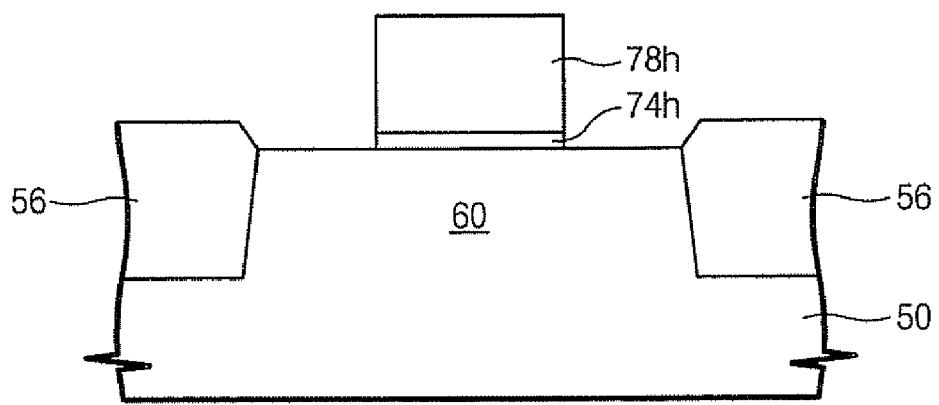
FIG. 10 is a cross-sectional view taken along the line E-E of a high voltage region of the non-volatile memory devices depicted in FIG. 9.

FIGS. 9 through 12 depict high and low voltage regions of non-volatile memory devices according to embodiments of the present invention. FIG. 9 is a top plane view of a high voltage transistor (operating at high voltage) that is disposed in the high voltage region of the device. FIG. 10 is a cross-sectional view, taken along a line E-E of the device of FIG. 9. As shown in FIGS. 9 and 10, in the high voltage region a pair of device isolation layers 56 define an active region 60. A high voltage gate electrode 78h is disposed on the active region 60. Additionally, a high voltage gate insulation layer 74h may be interposed between the high voltage gate electrode 78h and the active region 60 (see FIG. 10). This high voltage insulation layer 74h may comprise one or more layers.

Figure 11:
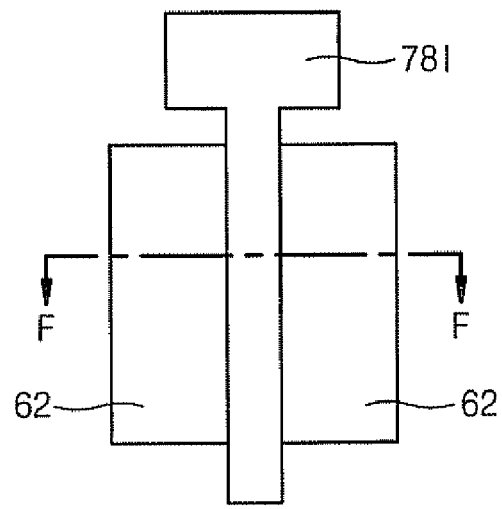
FIG. 11 is a top plane view of a low voltage region of nonvolatile memory devices in accordance with embodiments of the present invention.
Figure 12:
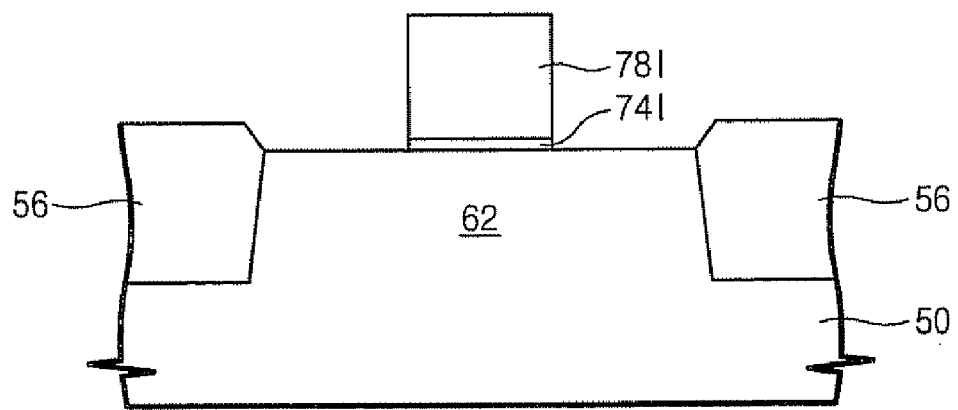
FIG. 12 is a cross-sectional view taken along the line F-F of the low voltage region of the non-volatile memory devices depicted in FIG. 11.

FIG. 11 is a top plane view of a low voltage transistor (that has a low operating voltage) that is disposed in the low voltage region of the device. FIG. 12 is a cross-sectional view, taken along a line F-F of the device of FIG. 11. As shown in FIGS. 11 and 12 a pair of device isolation layers 56 define an active region 62. A low voltage gate electrode 78l is disposed on the active region. Additionally, a low voltage gate insulation layer 74l may be interposed between the low voltage gate electrode 78l and the active region 62 (see FIG. 12). The low voltage gate insulation layer 74l may include one or more layers and might be, for example, a double layer.

FIGS. 13 through 41 are cross-sectional views illustrating non-volatile memory devices according to embodiments of the present invention and methods for fabricating these devices. In these figures, "b" refers to the cell region of the device, "c" refers to the high voltage region of the device taken along the line E-E of FIG. 9 and "d" refers to the low voltage region of the device taken along the line F-F of FIG. 11. The portion of these figures designated SR shows a cross-section of the device taken along the line C-C of FIG. 6. The portion designated WR shows a cross-section taken along the line D-D of FIG. 6.

FIGS. 13 through 20 are cross-sectional views showing non-volatile memory devices and methods of fabricating the same in accordance with first embodiments of the present invention. As shown in FIG. 13, a two layer pad insulation layer 53 comprising a pad oxide layer 53a and a pad nitride layer 53b is sequentially formed on a substrate 50 in the cell region "b", the high voltage region "c" and the low voltage region "d" of the device. The pad insulation layer 53 of high voltage region "c" is removed. As shown in FIG. 14, a first oxide layer 52a is formed on the substrate in the high voltage region "c" portion of the device. This may be accomplished by applying a thermal oxidation to the substrate 50.

As shown in FIG. 15, next the pad insulation layer 53 that was formed in the low voltage region is removed. The pad insulation layer 53 that was formed on the selection gate region SR of the cell region "b" is also removed. This may be accomplished by selectively etching using a photolithographic process. As is also shown in FIG. 15, a second oxide layer 54 may be formed on the substrate in both the low voltage region "d" and the selection gate region SR of cell region "b" by applying a thermal oxidation to the substrate 50. The first oxide layer 52a that was formed in the high voltage region "c" may increase in thickness to become first oxide layer 52 due to the thermal oxidation process.

As shown in FIG. 16, a hard mask layer 55 may be formed over the entire surface of the substrate 50 (i.e., it is deposited on the pad insulation layer 53 in the word line region WR of cell region "b", on the first oxide layer 52 in the high voltage region "c" and on the second oxide layer 54 in the low voltage region "d" and in the selection gate region SR of cell region "b."

As shown in FIG. 17, a plurality of device isolation layers 56 may then be formed on the substrate 50. The device isolation layers 56 define first active regions 58 in the cell region "b", second active regions 60 in the high voltage region "c", and third active regions 62 in the low voltage region "d". As shown in FIG. 17, the device isolation layers 56 may have a trench structure. These device isolation layers 56 may be formed by successively patterning the hard mask layer 55, the pad insulation layer 53, the first oxide layer 52, the second oxide layer 54 and the substrate 50 to form a plurality of trenches in the substrate 50. An insulation layer is formed to fill in the trenches. Then, chemical mechanical polishing may be used to expose the hard mask layer 55. This chemical mechanical polishing simultaneously turns the insulation layer into a plurality of device isolation layers 56. As shown in FIG. 17, the top surface of the device isolation layers 56 are disposed higher than the top region of the active regions 58, 60, 62.

Thereafter, the hard mask layer 55 may be removed and a pad insulation layer 53 may be formed on the cell region "b". The hard mask layer 55 and the pad nitride layer 53b may be removed by a wet etch using phosphoric acid. The pad oxide layer 53a may be removed by a wet etch using diluted solution of hydrogen fluoride (HF) or buffered oxide etchant (BOE). As a result, the protruding portions of the device isolation layers 56 in the of the cell region may have inclined sidewalls and the edges of the protruded portions may have a predetermine curvature.

As shown in FIG. 18, a lower oxide layer 64, a charge trapping layer 66 and an upper oxide layer 68 may be formed on entire surface of the substrate. The lower oxide layer 64 may be formed of, for example, silicon oxide, silicon oxynitride or metallic oxide. The charge trapping layer 66 may be formed of silicon nitride or silicon oxynitride. In particular embodiments of the present invention, the charge trapping layer 66 may be formed of a material having etch selectivity with respect to the lower oxide layer. The upper oxide layer 68 may be formed of silicon oxide, silicon oxynitride or insulative metallic oxide such as, for example, an aluminum oxide layer.

Figure 19:
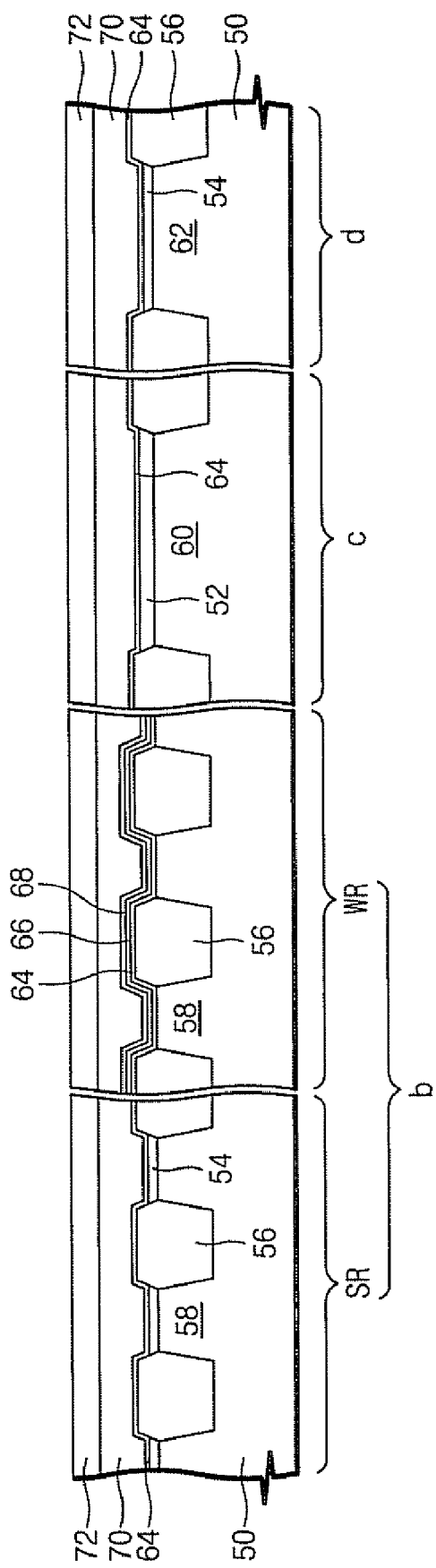

As shown in FIG. 19, the upper oxide layer 68 and the charge trapping layer 66 are removed in the selection gate region SR of cell region "b", the high voltage region "c" and the low voltage region "d". A conductive layer is then formed on the entire surface of the substrate 50. The conductive layer may be formed by first forming a polysilicon layer 70 and then forming a low resistance layer 72 on the substrate 50. The low resistance layer 72 may be formed of tungsten, tungsten silicide, titanium silicide or cobalt silicide.

As shown in FIG. 20, the low resistance layer 72 and the polysilicon layer 70 are successively patterned to form word lines 78w in the word line region WR of the cell region "b" and selection gate lines 78s at the selection gate region SR of cell region "b". The word lines 78w and the selection gate lines 78s cross over the device isolation layers 56. Additionally, a high voltage gate electrode 78h is formed on the high voltage region "c" and a low voltage gate electrode 78l is formed on the low voltage region "d". The high voltage gate electrode 78h crosses over the second active region 60 and the low voltage gate electrode 78l crosses over the third active region 62. A charge storage insulator 74c that comprises a stacked lower oxide layer 64, a charge trapping layer 66 and an upper oxide layer 68 is interposed between the word lines 78w and the first active regions 58. The charge storage insulator 74c may be formed on an entire surface of the word line region Wk or alternatively may be formed only under the word lines 78w.

As is also shown in FIG. 20, a second oxide layer 54 and a lower oxide layer 64 are interposed between the selection gate lines 78s and the first active regions 58. A high voltage gate insulation layer 74h is interposed between the high voltage gate electrode 78h and the second active region 60. As shown in FIG. 20, this high voltage gate insulation layer 74h may comprise a patterned first oxide layer 52a onto which a patterned lower oxide layer 64a is stacked. A low voltage gate insulation layer 74l is interposed between the low voltage gate electrode 78l and the third active region 62. This low voltage gate insulation layer 74l may comprise a patterned second oxide layer 52a onto which a patterned lower oxide layer 64a is stacked.

The charge trapping insulation layer 74c may cover the entire surface of the word line region WR (not shown in the drawings). As noted above, the charge trapping insulation layer 74c may comprise a stacked semiconductor structure comprising a lower oxide layer 64, a charge trapping layer 66 and an upper oxide layer 68. The high voltage gate insulation layer 74h may cover the second active region 60 on both sides of the high voltage gate electrode 78h. Similarly, the low voltage gate insulation layer 74l may cover the third active region 62 on both sides of the low voltage gate electrode 78l. This occurs because the insulation layers disposed under the high voltage gate electrode 78h and the low voltage gate electrode 78l are not removed during the etch process due to the etch selectivity of polysilicon and silicon oxide. The residual insulation layer may be removed in an over-etch process or in a cleaning process or it may be left in place.

An interlayer insulation layer may be formed on the substrate with the gate lines 78w, the high voltage gate electrode 78h and the low voltage gate electrode 78l. A line-shaped conductive pattern that corresponds to a common source line and a plurality of plug-type conductive patterns that correspond to a bit line plug are formed in the interlayer insulation layer parallel to the word lines 78w. Electrodes which are electrically connected to the second active region 60 and the third active region 62 may be formed simultaneously.

FIGS. 21 through 26 are cross-sectional views showing a non-volatile memory devices and methods of fabricating the same in accordance with second embodiments of the present invention. As shown in FIG. 21, a pad insulation layer 53 is formed on the substrate 50 in both the cell region "b" and in the low voltage region "d". A first oxide layer 52 is also formed on the substrate 50 in the a high voltage region "c". The pad insulation layer 53 and the first oxide layer 52 may be formed in the manner discussed above with respect to the embodiment depicted in FIGS. 13 and 14. A hard mask layer 55 may then be formed on the entire surface of the substrate 50.

As shown in FIG. 22, a plurality of device isolation layers 56 are formed on the semiconductor substrate 50. The device isolation layer 56 may be formed using trench isolation technology and/or by the methods discussed above with respect to the first set of embodiments of the present invention. The device isolation layers 56 define a plurality of first active regions 58 in the cell region "b", a second active region 60 in the high voltage region "c" and a third active region 62 in the low voltage region "c". The hard mask layer 55 is then removed and the pad insulation layer 53 is removed from both the cell region "b" and the low voltage region "d".

A lower oxide layer 64 and a charge-trapping layer 66 are formed over the entire surface of the substrate. As illustrated in FIG. 23, the charge trapping layer 66 may then be removed from the high voltage region "c", from the low voltage region "d" and the selection gate region SR of the cell region "b".

As shown in FIG. 24, a second oxide layer 76 may then be formed on the entire surface of the substrate. This second oxide layer 76 may then be removed from the cell region "b". The second oxide layer 76 may comprise, for example, a silicon oxide, a silicon oxynitride or an insulation metal oxide layer. The charge trapping layer 66 may be formed of silicon oxynitride. Such an embodiment allows the second oxide layer 76 of the cell region "b" to be removed using the charge trapping layer 66 as an etch stop layer. In another approach, the second oxide layer 76 may be formed using a thermal oxidation process. In this case, the second oxide layer 76 is not formed on the charge trapping layer 66 and therefore the step of removing the second oxide layer 76 is not required.

As illustrated in FIG. 25, next an upper oxide layer 68 may be formed on the entire surface of the substrate. The upper oxide layer 68 is then removed from the high voltage region "c" and the low voltage region "d". The upper oxide layer 68 may be formed of an insulation metal oxide such as, for example, aluminum oxide. Generally, an aluminum oxide layer is known to have etch selectivity with respect to a silicon oxide layer. As a result, the second oxide layer 76 that is disposed under the upper oxide layer 68 is not etched when the upper insulation layer 68 in the high voltage region "c" and the low voltage region "d" are removed via an etch process. As is also seen in FIG. 25, these processing steps leave a lower oxide layer 64, a charge trapping layer 66 and an upper oxide layer 68 stacked in the word line region WR of the cell region "b" while a lower oxide layer 64, a second oxide layer 76 and an upper oxide layer 68 are stacked on the selection gate region SR of the cell region "b". In the high voltage region "c" a first oxide layer 52, a lower oxide layer 64 and a second oxide layer 76 are stacked on the substrate 50 and in the low voltage region "d" a lower oxide layer 64 and a second oxide layer 76 are stacked on the substrate 50.

As is also shown in FIG. 25, a double layer conductive layer that comprises a polysilicon layer 70 and a low resistance layer 72 is formed over the entire surface of substrate. The low resistance layer 72 may be formed, for example, of tungsten, tungsten silicone, titanium silicide or cobalt silicide.

Figure 26:
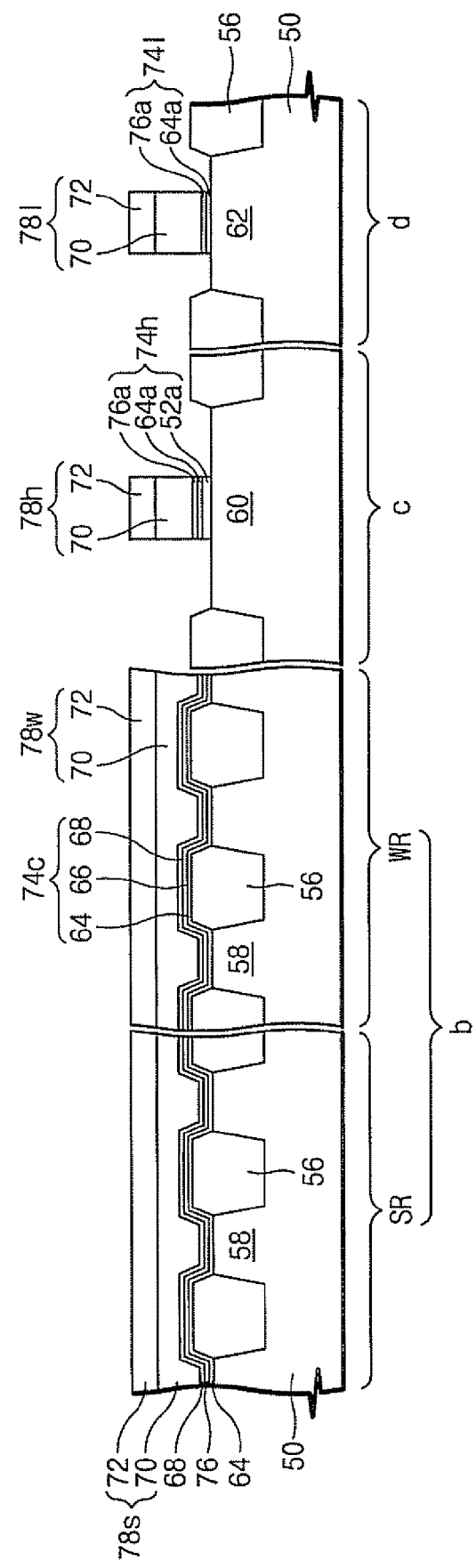

As shown in FIG. 26, the low resistance layer 72 and the polysilicon layer 70 may then be successively patterned to form word lines 78w in the word line region WR, a selection gate line 78s in the selection gate region SR, a high voltage gate electrode 78h in the high voltage region "c" and a low voltage gate electrode 78l in the low voltage region "d". As shown in FIG. 26, both the word lines 78w and the selection gate line 78s cross over the device isolation layers 56. The high voltage gate electrode 78h crosses over the second active region 60 and the low voltage gate electrode 78l crosses over the third active region 62. A charge storage insulation layer 74c that comprises a lower oxide layer 64, a charge trapping layer 66 and an upper oxide layer 68 is interposed between the gate lines 78w and the first active regions 58. This charge storage insulation layer may cover the entire top surface of the word line region WR. A high voltage gate insulation layer 74h is interposed between the high voltage gate electrode 78h and the second active region 60. This high voltage gate insulation layer 74h may comprise a stacked semiconductor structure that includes a patterned first oxide layer 52a, a patterned lower oxide layer 64a and a patterned second oxide layer 76a. A low voltage gate insulation layer 74l is similarly interposed between the low voltage gate electrode 78l and the third active region 62. This low voltage gate insulation layer 74l may comprise stacked semiconductor structure that includes a patterned lower insulation layer 64a and a patterned second oxide layer 76a.

FIGS. 27 through 32 are cross-sectional views showing non-volatile memory devices and methods of fabricating the same in accordance with third embodiments of the present invention. As shown in FIG. 27, a first pad insulation layer 53 is formed on the word line region WR of the cell region "b". This first pad insulation layer 53 comprises a pad oxide layer 53a and a pad nitride layer 53b that are sequentially stacked. The pad oxide layer 53a is also formed on the low voltage region "d" and on the selection gate region SR of the cell region "b". A first oxide layer 52 is formed on the high voltage region "c".

As shown in FIG. 28, device isolation layers 56 are next formed on a substrate to define a plurality of first active regions 58 in the cell region "b", a second active region 60 in the high voltage region "c", and a third active region 62 in the low voltage region "d". Then, the pad oxide layer 53a is removed from the low voltage region "d" and the selection gate region SR of the cell region "b". A portion of the first oxide layer 52 is etched to reduce the thickness of the first oxide layer 52. The pad oxide layer 53a in the word line region WR is not etched during the etch of the first oxide layer 52 because it is protected by the pad nitride layer 53b.

Figure 29:
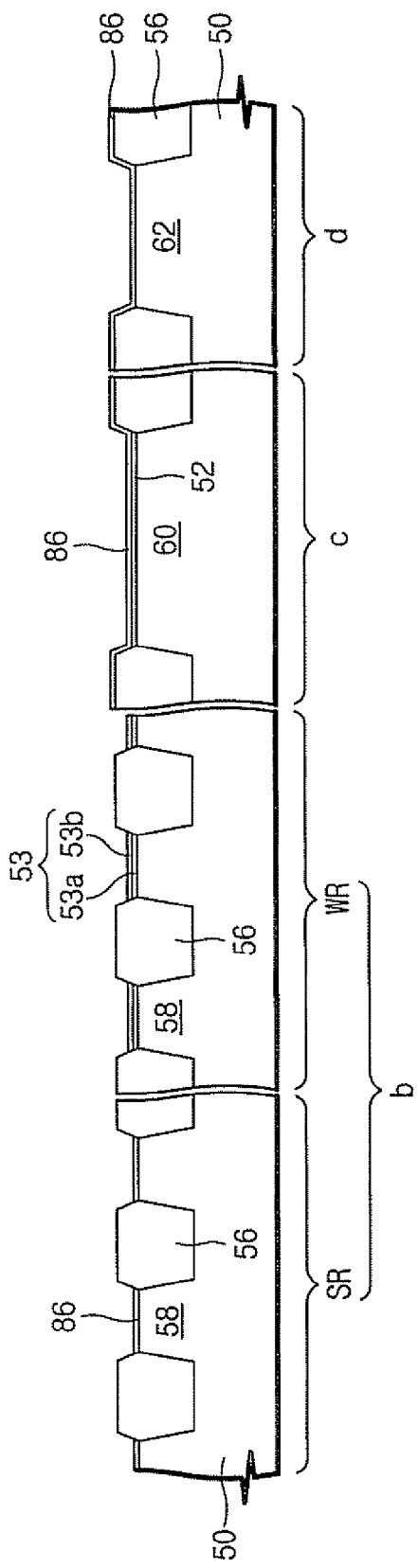

As shown in FIG. 29, a second oxide layer 86 may then be formed on the entire surface of the substrate 50. This second oxide layer 86 may then be removed from the word line WR portion of the cell region "b". The second oxide layer 86 may also be formed using a thermal oxidation process. When a thermal oxidation process is used, the second oxide layer 86 is not formed on the pad nitride layer 53b and the step of removing the second oxide layer 86 from the word line region WR is not required.

Figure 30:
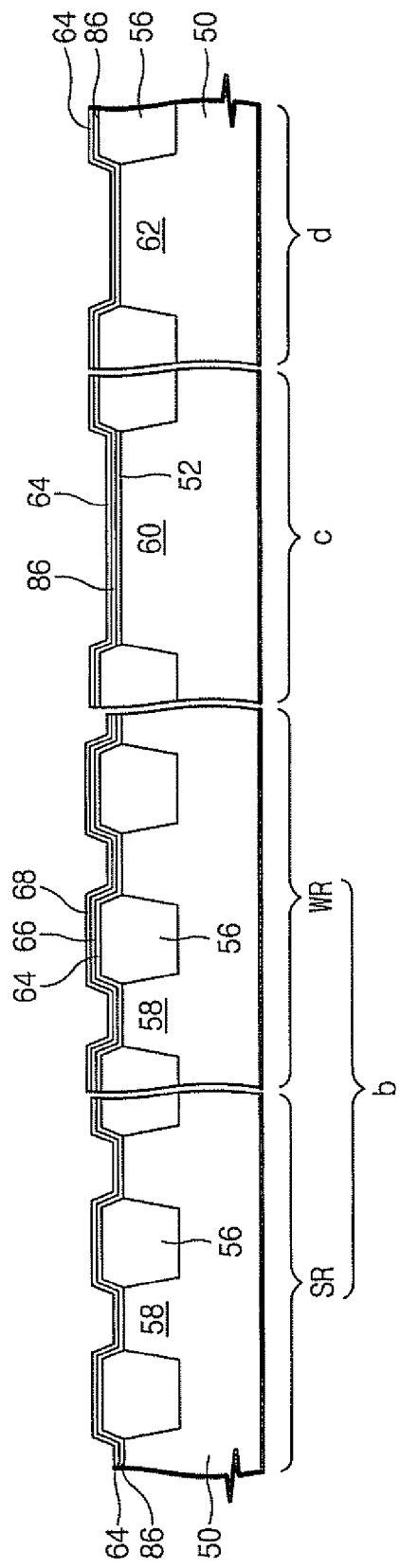

Next, a lower oxide layer 64, a charge trapping layer 66 and an upper oxide layer 68 are formed on an entire surface of the substrate 50. As shown in FIG. 30, the upper oxide layer 68 and the charge trapping layer 66 may be removed from the selection gate region SR of cell region "b", the high voltage region "c" and the low voltage region "d".

Figure 31:
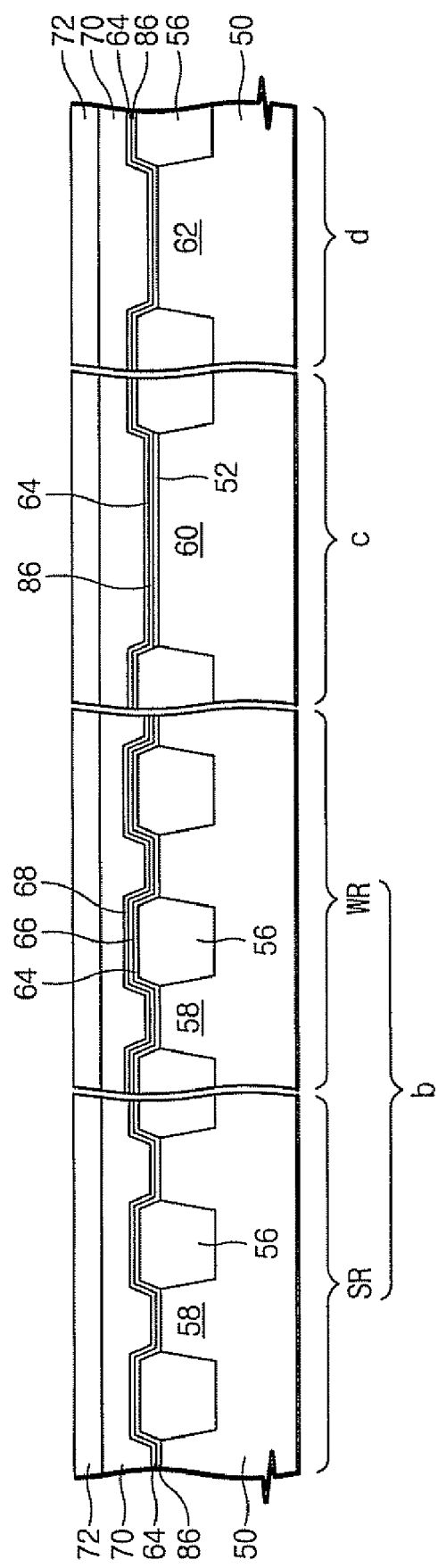

As shown in FIG. 31, thereafter a conductive layer may be formed on the entire surface of the substrate. This conductive layer may comprise a stacked low resistance layer 72 that is stacked on a polysilicon layer 70. The low resistance layer 72 may comprise, for example, a tungsten, tungsten silicide, titanium silicide or cobalt silicide layer.

Figure 32:
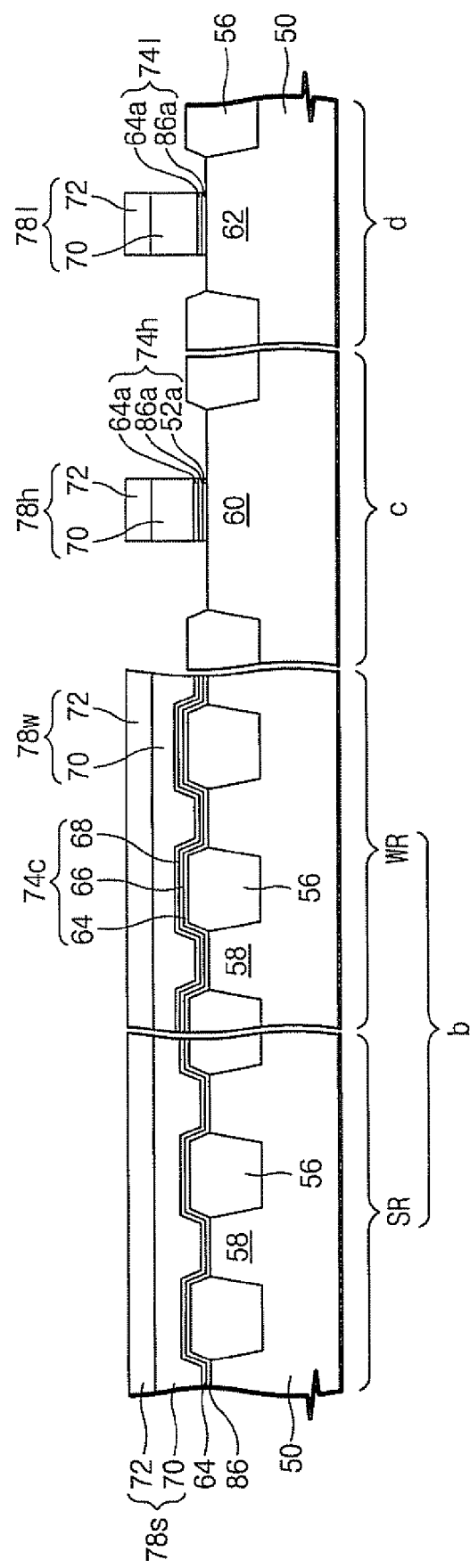

As shown in FIG. 32, the low resistance layer 72 and the polysilicon layer 70 are sequentially patterned to form (a) word lines 78w in the word line region WR, (b) a selection gate line 78s in the selection gate region SR, (c) a high voltage gate electrode 78h in the high voltage region "c" and (d) a low voltage gate electrode 78l in the low voltage region "d". Both the word lines 78w and the selection gate line 78s cross over the device isolation layers 56. The high voltage gate electrode 78h crosses over the second active region 60, and the low voltage gate electrode 78l crosses over the third active region 62. A charge storage insulator 74c, which comprises a lower oxide layer 64, a charge tapping layer 66 and an upper oxide layer 68, is interposed between the word lines 78w and the first active regions 58. The charge storage insulator 74c may cover the entire top surface of the word line region WR. A second oxide layer 86 and the upper oxide layer 64 are interposed between the selection gate line 78s and the first active regions 58 in the selection gate region SR. A high voltage gate insulation layer 74h is likewise interposed between the high voltage gate electrode 78h and the second active region 60. The high voltage gate insulation layer 74h may comprise a patterned first oxide layer 52a, a patterned second oxide layer 86a and a patterned lower oxide layer 64a. A low voltage gate insulation layer 74l is also interposed between the low voltage gate electrode 78l and the third active region 62. The low voltage gate electrode 78l may comprise a patterned second oxide layer 86a and a patterned lower oxide layer 64a.

Figure 33:
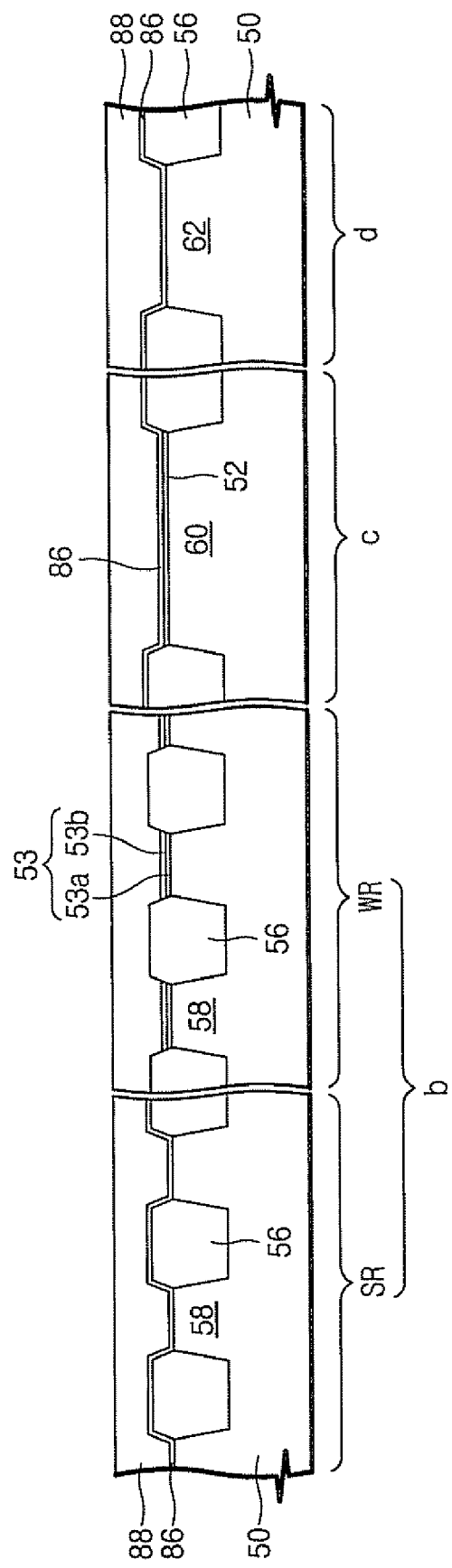
FIGS. 33 through 36 are cross-sectional views illustrating steps of fabricating non-volatile memory devices according to other embodiments of the present invention.

FIGS. 33 through 36 are cross-sectional views showing non-volatile memory devices and methods of fabricating the same in accordance with fourth embodiments of the present invention. In these embodiments, the fabrication steps discussed above with respect to FIGS. 27 through 29 are carried out to fabricate the structure depicted in FIG. 29. Then, as shown in FIG. 33, a first conductive layer 88 is formed on the second oxide layer 86 and the first pad insulation layer 53. This first conductive layer 88 may be formed of polysilicon.

Figure 34:
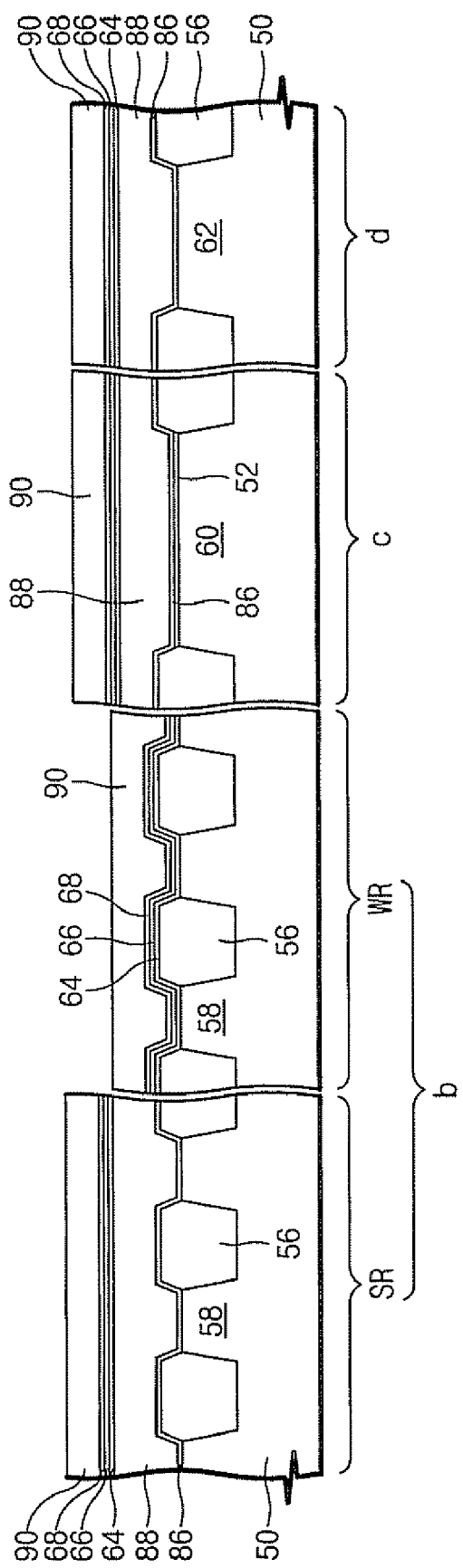

As shown in FIG. 34, the first conductive layer 88 and the pad insulation layer 53 are then removed from the word line region WR of the cell region "b" to expose the first active regions 58. Then, a lower oxide layer 64, a charge trapping layer 66 and an upper oxide layer 68 are sequentially formed on the entire surface of the substrate 50. Next, a second conductive layer 90 is formed on the upper oxide layer 68. The second conductive layer 90 may also be formed of polysilicon.

Figure 35:
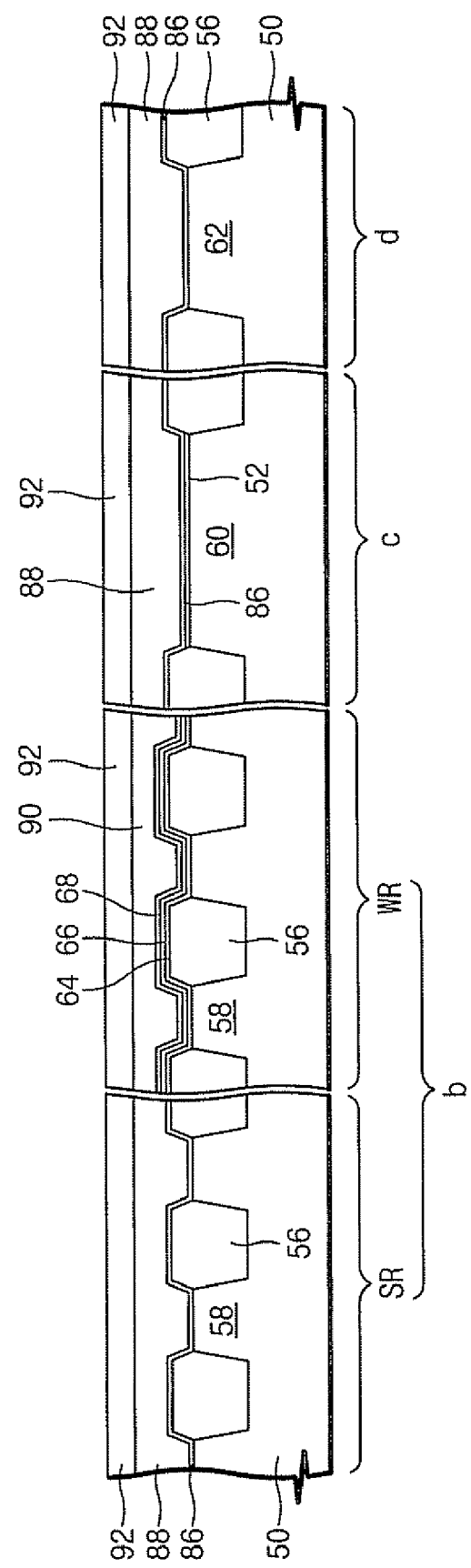

As shown in FIG. 35, the second conductive layer 90, the upper oxide layer 68, the charge trapping layer 66 and the lower oxide layer 64 are next removed from the selection gate region SR, the high voltage region "c" and the low voltage region "d". As a result, the word line WP is covered with second conductive layer 90, and the selection gate region SR, the high voltage region "c" and the low voltage region "d" are covered with the first conductive layer 88. A low resistance layer 92 is then formed on the entire surface of the substrate 50. The low resistance layer 92 may be, for example, a tungsten, tungsten silicide, titanium silicide or cobalt silicide layer. A polysilicon layer may be further formed on the entire surface of substrate.

Figure 36:
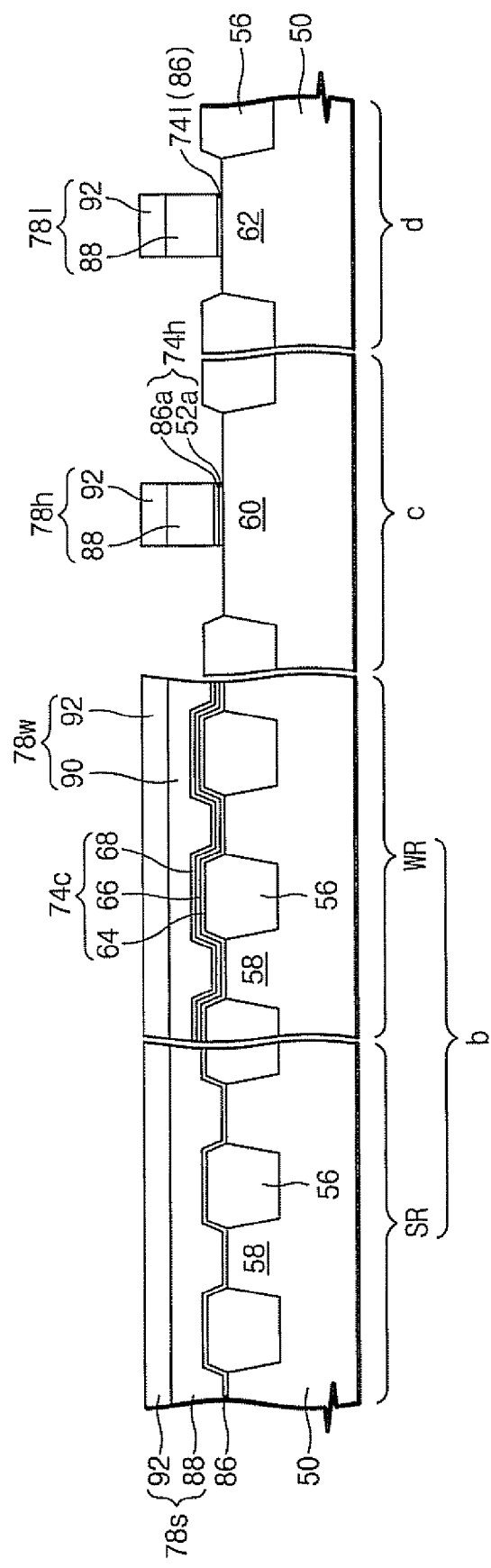

Referring next to FIG. 36, the low resistance layer 92 and the second conductive layer 90 are sequentially patterned in the word line region WR to form a plurality or parallel word lines 78w. The low resistance layer 92 and the first conductive layer 88 are patterned at the selection gate region SR to form selection gate lines 78s parallel to the word lines 78w. The low resistance layer 92 and the first conductive layer 88 are also patterned to form a high voltage gate electrode 78h in the high voltage region "c" and to form a low voltage gate electrode 78l in the low voltage region "d". As shown in FIG. 36, a high voltage gate insulation layer 74h that may comprise a patterned first oxide layer 52a and a second oxide layer 86a is interposed between the high voltage gate electrode 78h and the second active region 60. A low voltage gate insulation layer 74l that is formed of a patterned second oxide layer is likewise interposed between the low voltage gate electrode 78h and the third active region 62.

Figure 37:
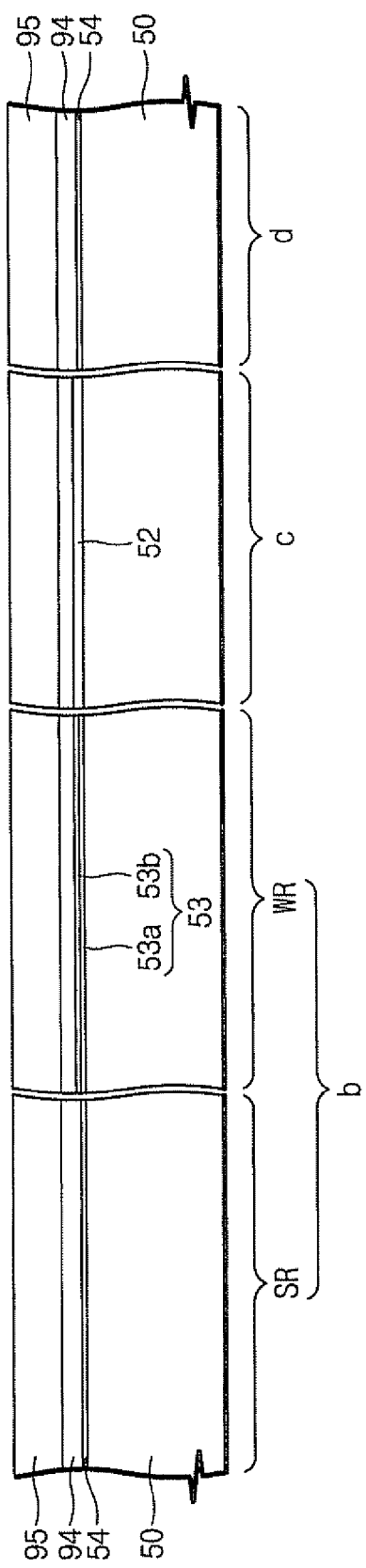
FIGS. 37 through 41 are cross-sectional views illustrating steps of fabricating non-volatile memory devices according to still further embodiments of the present invention.

FIGS. 37 through 41 are cross-sectional views showing non-volatile memory devices and methods of fabricating the same in accordance with fifth embodiments of the present invention. As shown in FIG. 37, a pad insulation layer 53 comprising a pad oxide layer 53a and a pad nitride layer 53b are formed on the substrate in the word line region WR of the cell region "b". A first oxide layer 52 is formed on the substrate in the high voltage region "c" and a second oxide layer 54 is formed on the substrate in the selection gate region SR of cell region "b" and in the low voltage region "d". Then, a first conductive layer 94 and a hard mask layer 95 are formed. The first conductive layer 94 may be formed of polysilicon and the hard mask layer 95 may be formed of silicon nitride.

Figure 38:
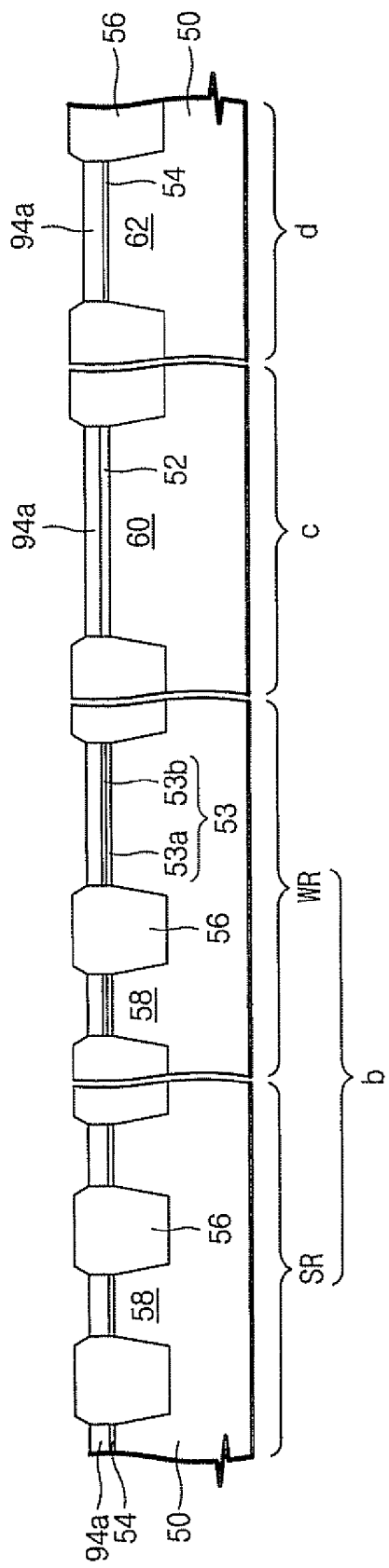

As shown in FIG. 38, trench device isolation layers 56 are formed in the substrate 50 and then the hard mask layer 95 is removed. The device isolation layers 56 may be formed using self-aligned shallow trench isolation technology. The device isolation layers 56 define a plurality of first active regions 58 in the cell region "b", a second active region 60 in the high voltage region "c", and a third active region 62 in the low voltage region "d". A first conductive pattern 94a is formed on the active regions 58, 60 and 62. The first conductive pattern 94a is disposed between the device isolation layers 56 such that the sidewalls of each portion of the first conductive pattern 94a are in contact with the sidewalls of the adjacent device isolation layers 56.

Figure 39:
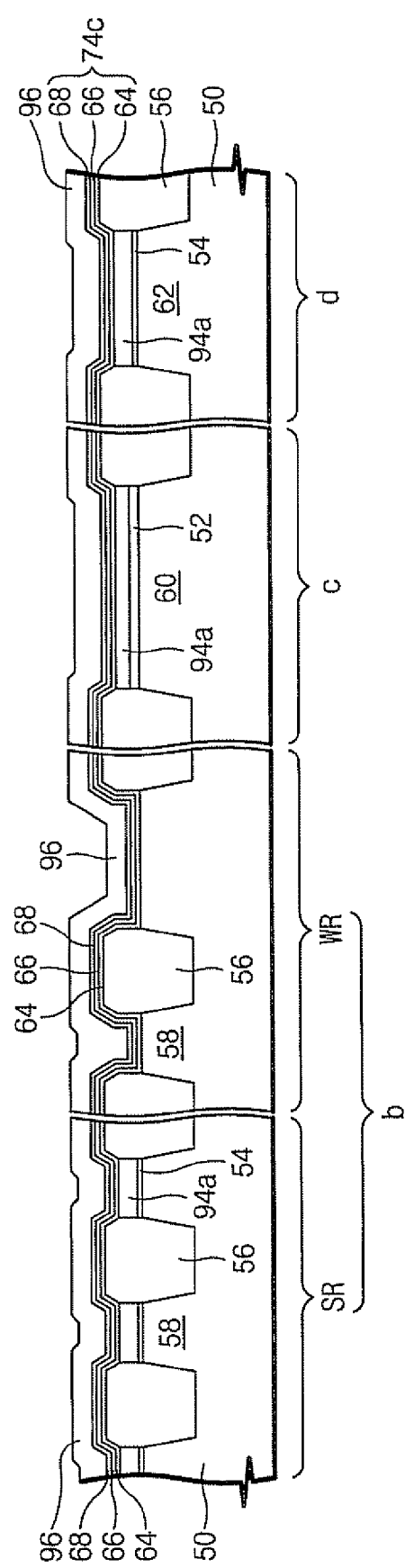

Next, as shown in FIG. 39, the first conductive pattern 94a and the pad insulation layer 53 are removed from the word line region WR. A lower oxide layer 64, a charge trapping layer 66 and an upper oxide layer 68 are sequentially formed on the entire surface of the substrate. A second conductive layer 96 is formed on the upper oxide layer 68. The second conductive layer 96 may be formed of polysilicon.

Figure 40:
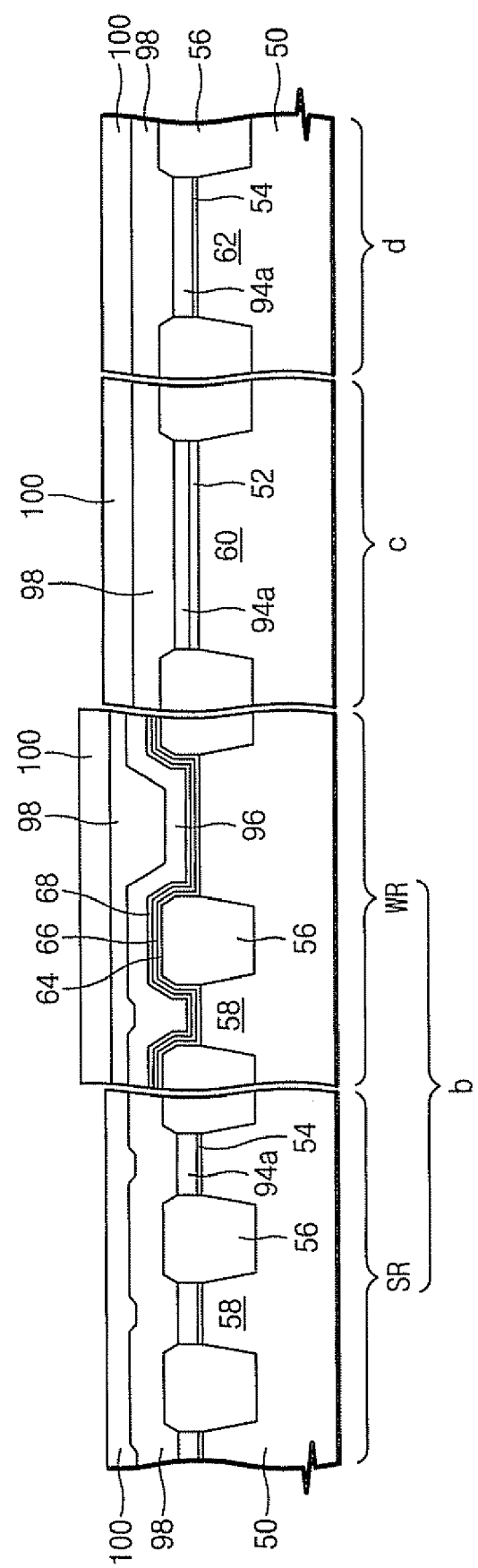

As shown in FIG. 40, the second conductive layer 96, the upper oxide layer 68, the charge trapping layer 66 and the lower oxide layer 64 are removed in the selection gate region SR, the high voltage region "c" and the low voltage region "d", thereby exposing the first conductive pattern 94a and the device isolation layers 56. A third conductive layer 98 and a low resistance layer 100 are formed on the entire surface of the substrate. The third conductive layer 98 may be formed of polysilicon and the low resistance layer 100 may be formed of tungsten, tungsten silicide, titanium silicide or cobalt silicide.

Figure 41:
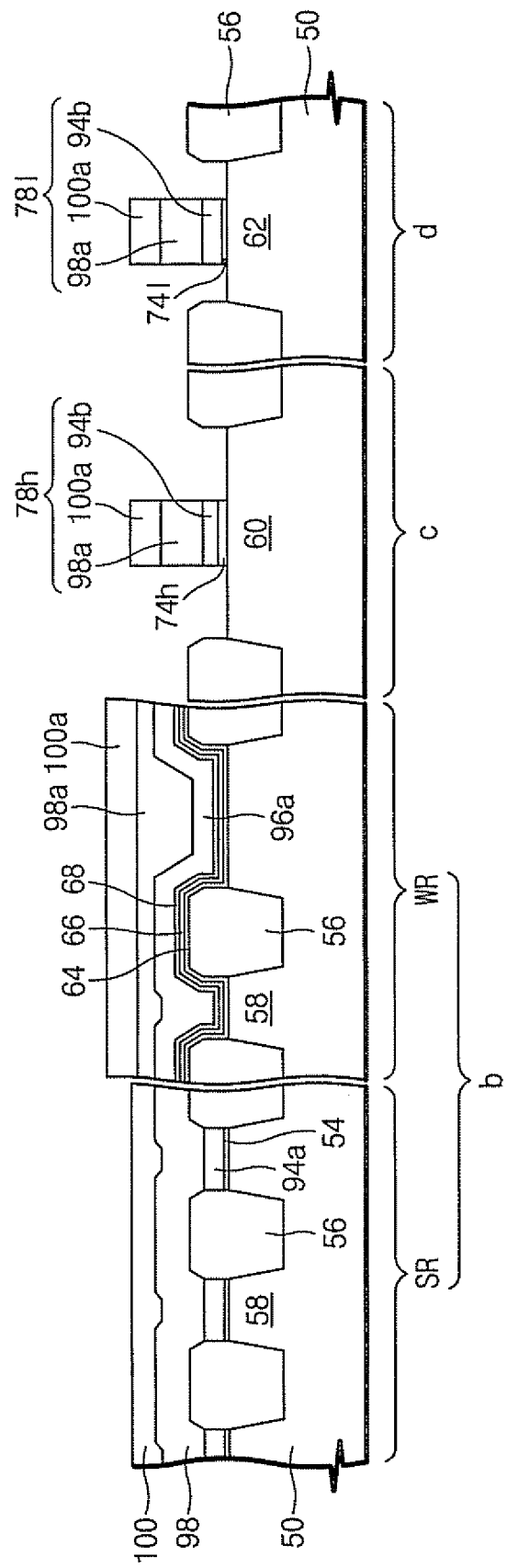

As shown in FIG. 41, the low resistance layer 100, the third conductive layer 98 and the second conductive layer 96 are patterned to form a plurality of parallel word lines in the word line region WR. The low resistance layer 100, the third conductive layer 98 and the conductive pattern 94a are patterned at the selection gate region SR to from selection gate lines in parallel to the word lines. The low resistance layer 100, the third conductive layer 98 and the first conductive patterns 94a are patterned in the high voltage region "c" and the low voltage region "d" to form a high voltage gate electrode 78h and a low voltage gate electrode 78l, respectively. In the embodiments depicted in FIG. 41, the gate lines 78w may be comprised of the second conductive pattern 96a, the third conductive pattern 98a, and the low resistance patterned layer 100a. The high voltage gate electrode 78h and the low voltage gate electrode 78l are triple layer structures comprising the first conductive pattern 94b, the third conductive pattern 98a and the low resistance patterned layer 100a. A high voltage gate insulation layer 74h that comprises a first oxide layer is interposed between the high voltage gate electrode 78h and the second active region 60. Likewise, a low voltage gate insulation layer 74l that comprises a second oxide layer is interposed between the low voltage gate electrode 78l and the third active region 62.

In the above-described embodiments of the present invention, the lower oxide layer 64 may be formed of, for example, silicon oxide, silicon oxynitride or metal oxide. The charge trapping layer 66 may be formed of silicon nitride or silicon oxynitride. The charge trapping layer 66 may be formed of material having etch selectivity with respect to the lower oxide layer. The upper oxide layer 68 may, for example, be formed of silicon oxide, silicon oxynitride or an insulate metal oxide such as aluminum oxide. In non-volatile memory devices according to embodiments of the present invention, the charge storage insulator 74c may cover the cell region or, alternately, may be disposed only under the gate lines. Likewise, the high voltage gate insulation layer 74h and the low voltage gate insulation layer 74l may be formed only under the gate electrode or also formed on the active region on both sides of the gate electrode.

Figure 42A:
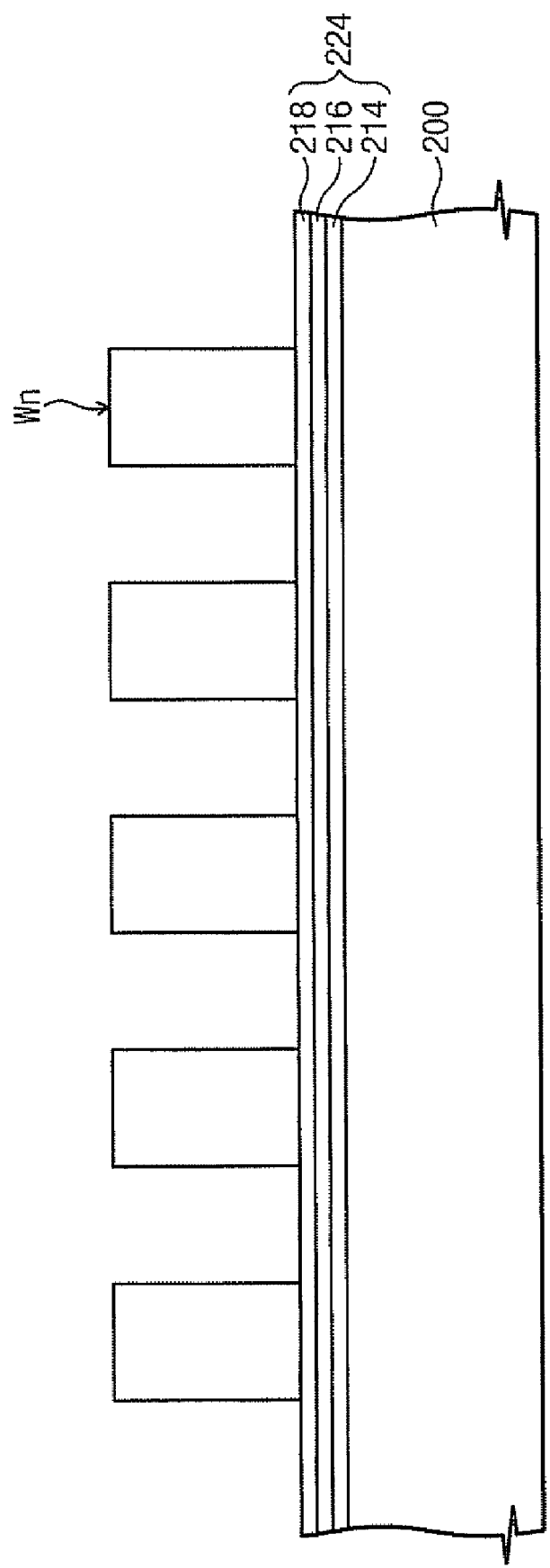
FIG. 42A is a cross-sectional view, taken along a line B-B of FIG. 6, illustrating a part of a wordline region WR of a non-volatile memory device according to embodiments of the present invention.

FIG. 42A is a cross-sectional diagram, taken along the line B-B of FIG. 6, illustrating a part of a wordline region WR of a non-volatile memory device according to certain embodiments of the present invention. As illustrated in FIG. 42A, a charge storage insulation layer 224 may be disposed to cover an entire surface of a substrate 220 where device isolation layers and active regions are formed. A plurality of wordlines Wn are disposed on the charge storage insulation layer 224 to cross over the active regions and the device isolation layers. The charge storage insulation layer 224 may include a lower insulation layer 214, a charge storage layer 216, and an upper insulation layer 218. The upper insulation layer 218 may include at least one metal oxide layer. The metal oxide layer may include a metal listed in Group III or VB of the Periodic Table. The metal oxide layer may also be doped with elements listed in Group IV of the Periodic Table. Thus, for example, the metal oxide layer may be made of at least one selected from the group consisting of $Al_2O_3$, $HfO_2$, HfAlO, HfAlON, $ZrO_2$, ZrAlO, HfSiO, and HfSiON. The upper insulation layer may further include a protective insulation layer sandwiched between the metal oxide layer and the gate lines (including the word lines, the ground select lines and the string select lines) in certain embodiments of the present invention.

Figure 42B:
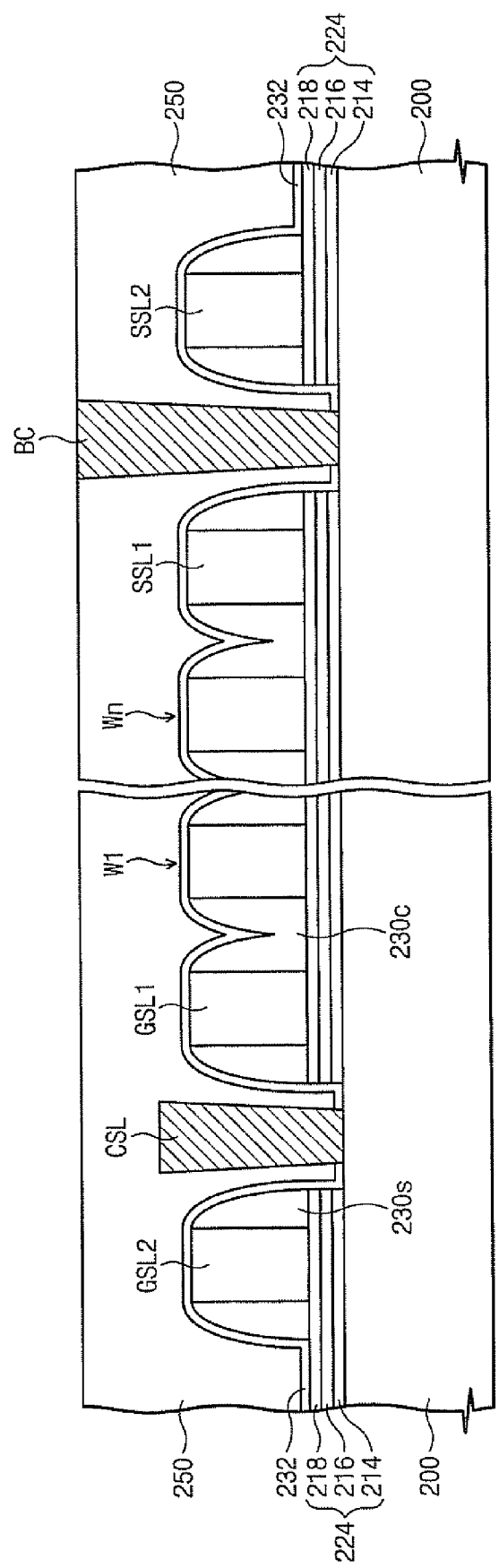
FIG. 42B illustrates a modified embodiment where spacer insulation layers are formed on sidewalls of wordlines WN, ground select lines GSLn, and string select lines SSLn, respectively.

The non-volatile memory devices according to embodiments of the present invention may also include spacer insulation layers on sidewalls of the wordlines Wn, the round select lines GSLn, and/or the string select lines SSLn. FIG. 42B illustrates one such embodiment of the present invention in which spacer insulation layers are included on sidewalls of the wordlines Wn, the ground select lines GSLn, and the string select lines SSLn.

As illustrated in FIG. 6, adjacent wordlines (e.g., W1 and W2) are spaced apart by a first distance. The wordlines that are adjacent to a ground select line (e.g., W1 and GSL1) are also spaced by the first distance, as are the wordlines that are adjacent to a string select line (e.g. Wm and SSL2). Adjacent ground select lines (e.g., GSL2 and GSL1) are spaced by a second distance that is longer than the first distance. Adjacent string select lines (e.g., SSL1 and SSL2) are likewise spaced by the second distance.

As illustrated in FIG. 42B, between gate lines spaced by a first distance, (e.g., wordlines W1 and ground select line GSL1 and wordline Wn and string select line SSL1), first spacer insulation layers 230c are provided. As shown in FIG. 42B, the first spacer insulation layers 230c on facing sidewalls of adjacent gate lines connect with each other. As is also shown in FIG. 42B, with respect to adjacent gate lines that are spaced by the second distance (e.g., ground select lines GSL2 and GSL1 and string select lines SSL1 and SSL2), second spacer insulation layers 230s are provided that are spaced apart from each other and that do not connect like the first spacer insulation layers 230c.

As is also shown in FIG. 42B, the charge storage layer 224 is removed in the area between the ground select lines GSLn-1 and GSLn and in the area between the string select lines SSLn-1 and SSLn. The portion of the charge storage layer that is removed may be aligned with the edges of the second spacer insulation layer 230s. Each removed portion of the charge storage layer 224 may expose an active region. According to some embodiments of the present invention, even when other insulation layers (not shown in FIG. 42B) are included in the area between adjacent ground select lines and/or in the area between adjacent string select lines, the edges of the charge storage layer 224 are aligned with respective sidewalls of the spacer insulation layers 230s to expose the active regions, irrespective of the kinds and/or stacked configuration of the insulation layers.

As is also illustrated in FIG. 42B, in certain embodiments of the present invention, an etch-stop layer 232 may be disposed conformally on an entire surface of the substrate 200. An interlayer dielectric 250 may then be disposed uniformly on the etch-stop layer 232. A common source line CSL and a bitline contact BC are connected with respective active regions through the interlayer dielectric 250 and the etch-stop layer 232.

In a non-volatile memory device according to further embodiments of the present invention, the thickness of the charge storage insulation layer 224 in the regions between the wordlines Wn may be smaller (i.e., thinner) than the thickness of the charge storage insulation layer 224 in the regions below the wordlines Wn. FIGS. 43A-47A and FIGS. 43B-47B are cross-sectional diagrams of a wordline region, each being taken along a line B-B of FIG. 6, of exemplary embodiments of the present invention that include such a configuration. In each case, the Fig. that includes the designation "A" (e.g., FIG. 43A) is a cross-sectional diagram of the device after the formation of the wordlines, whereas the Fig. with the same number that is designated "B" (e.g., FIG. 43B) is a cross-sectional diagram of the device after additional layers have been formed.

Figure 43A:
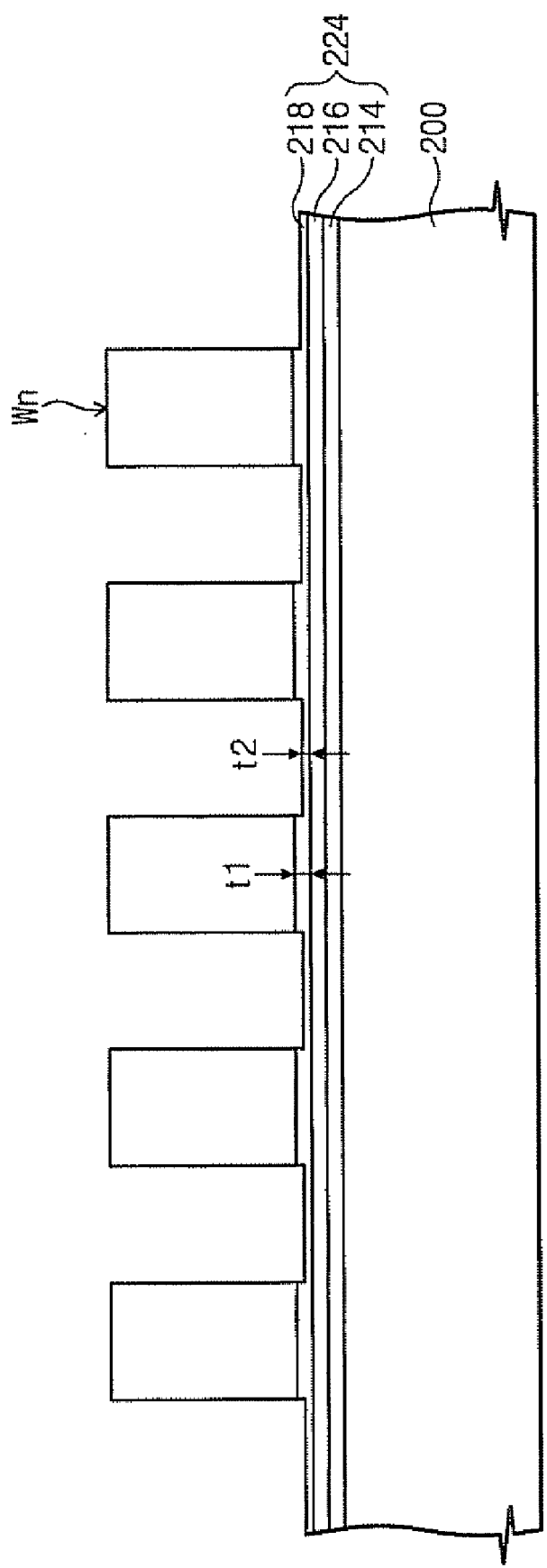

As illustrated in FIG. 43A, the non-volatile memory device according to one such embodiment of the present invention includes a charge storage insulation layer 224 that comprises a lower insulation layer 214, a charge storage layer 216, and an upper insulation layer 218. The upper insulation layer 218 has recessed regions between the wordlines that are aligned with the sidewalls of the respective wordlines Wn. As a result, the upper insulation layer 218 in the regions between adjacent wordlines Wn is thinner than the upper insulation layer 218 in the regions below the wordlines Wn. Alternatively, the upper insulation layer 218 in the regions between the wordlines Wn may be removed completely to expose the charge storage layer 216.

Figure 43B:
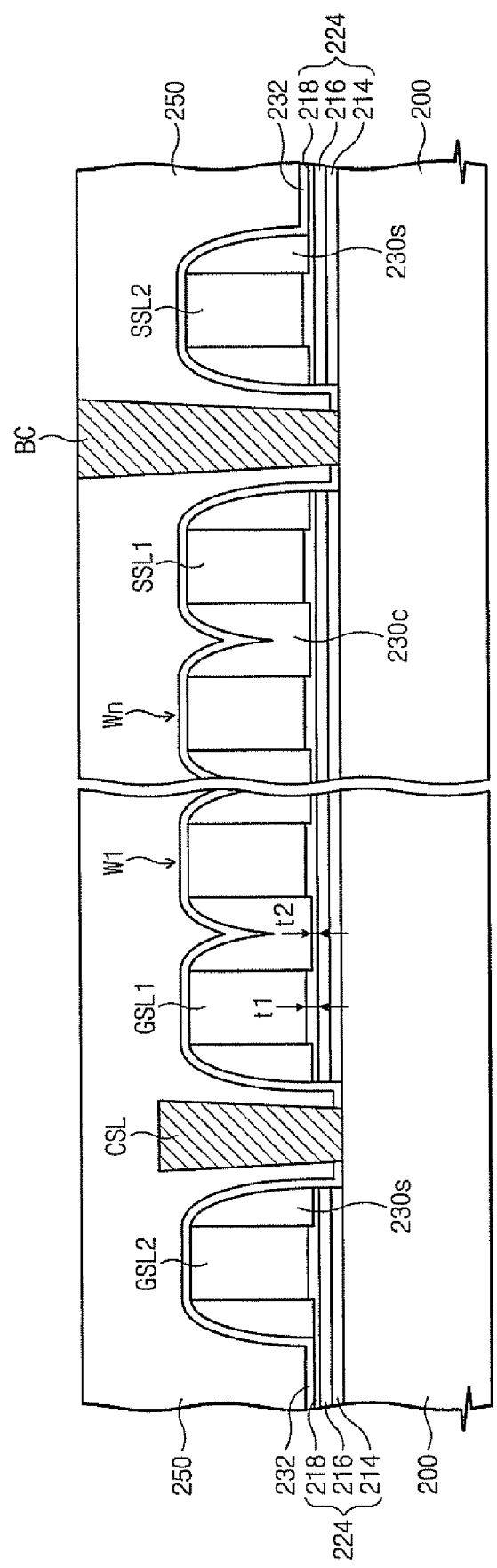

As in the embodiments of FIG. 42B in the embodiment of FIG. 43 (see FIG. 43B), the distance between each word line and any other adjacent gate line is a first distance, whereas the distance between adjacent select lines is a second distance. First spacer insulation layers 230c are disposed on sidewalls of adjacent gate lines that are separated by the first distance such that the first spacer insulation layers 230c on opposing gate lines connect with each other. Between gate lines spaced by the second distance, second spacer insulation layers 230s are provided which are spaced apart from each other. The portions of the charge storage layer 224 between adjacent ground select lines and between adjacent string select lines are removed to expose active regions. The portions removed are aligned with the sidewalls of the second spacer insulation layers 230s. Even when other insulation layers are disposed between adjacent ground select lines and/or between adjacent string select lines, they are aligned with sidewalls of the spacer insulation layers 230s to expose active regions, irrespective of kinds and stacked configuration of the insulation layers.

Figure 44A:
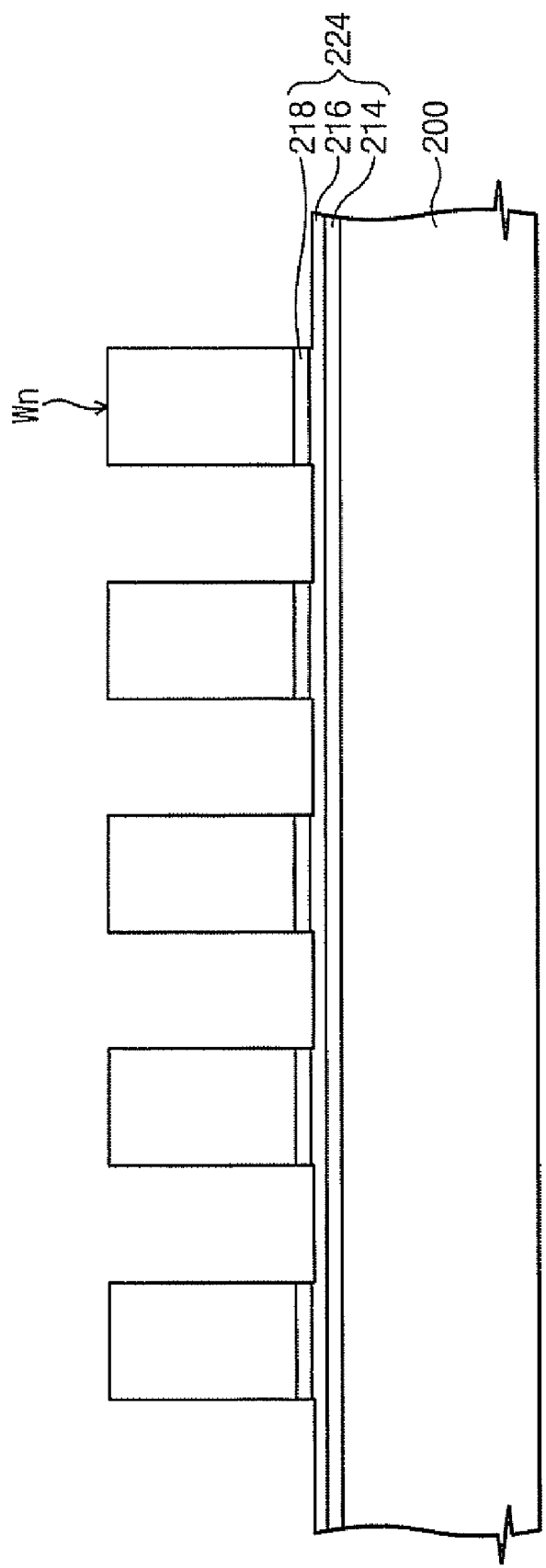
Figure 44B:
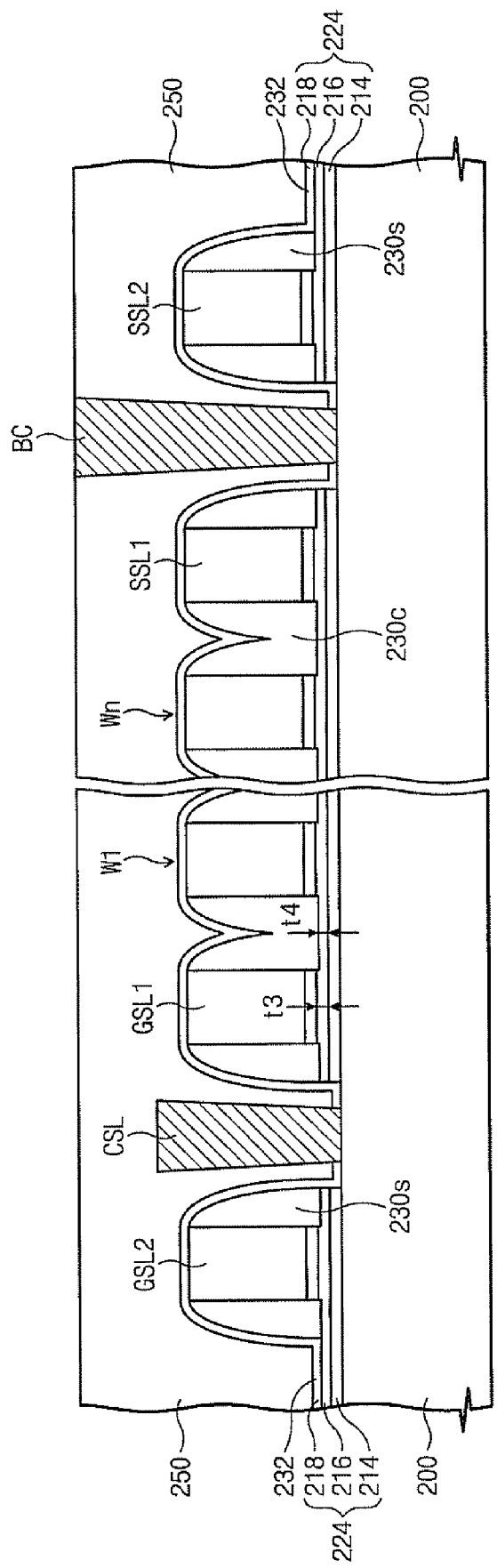

FIGS. 44A and 44B depict another embodiment of the present invention. As illustrated in FIG. 44A, in the regions between adjacent wordlines, a portion of the charge storage layer 216 as well as the upper insulation layer 218 are removed. As a result, the charge storage insulation layer 216 in the regions between adjacent wordlines Wn is thinner than the charge storage insulation layer 216 in the regions below the wordlines Wn.

In the non-volatile memory devices according to embodiments of the present invention, the charge storage layer may, for example, be a silicon-rich oxide or an insulation layer including conductive dots rather than an insulation layer. As is shown in FIG. 44B, spacer insulation layers 230c and 230s may be disposed on sidewalls of the wordlines Wn, sidewalls of the ground select lines GSLn-1 and GSL, and sidewalls of the string select lines SSLn-1 and SSLn. As in the embodiment of FIGS. 43A and 43B described above, edges of the charge storage layer 224 may be discontinuous, having edges that are aligned with the spacer insulation layers 230s in the regions between adjacent ground select lines and in the regions between adjacent string select lines to expose active regions.

Figure 45A:
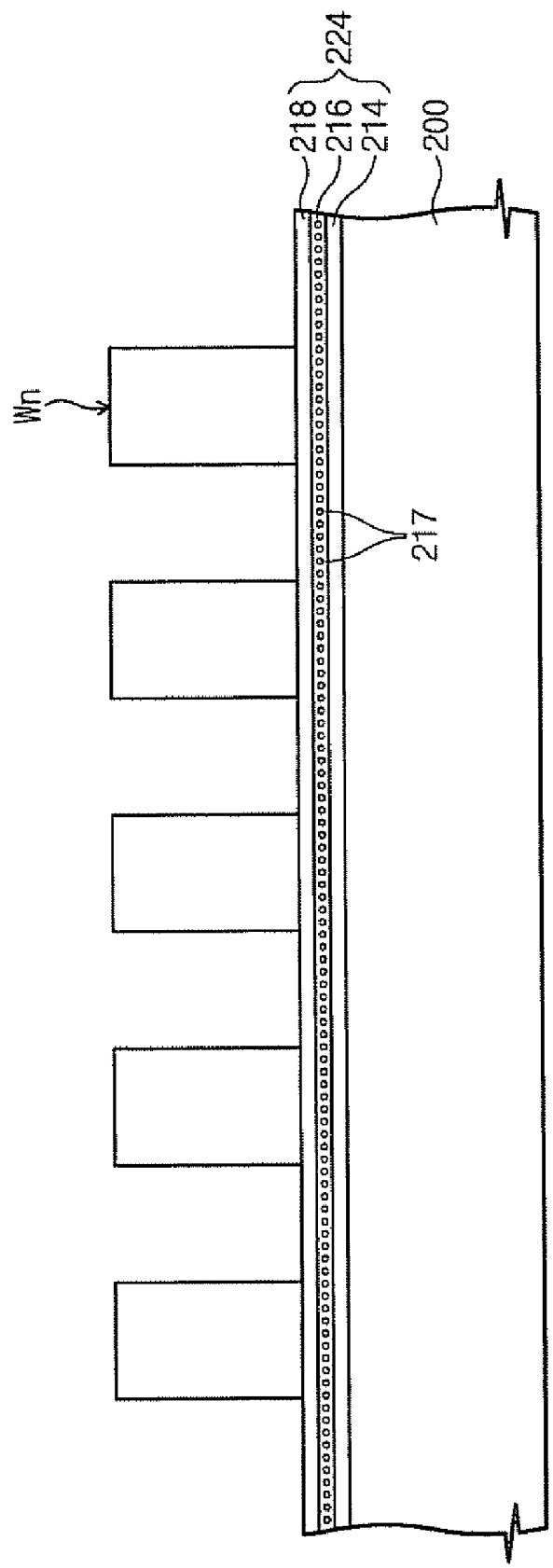
Figure 45B:
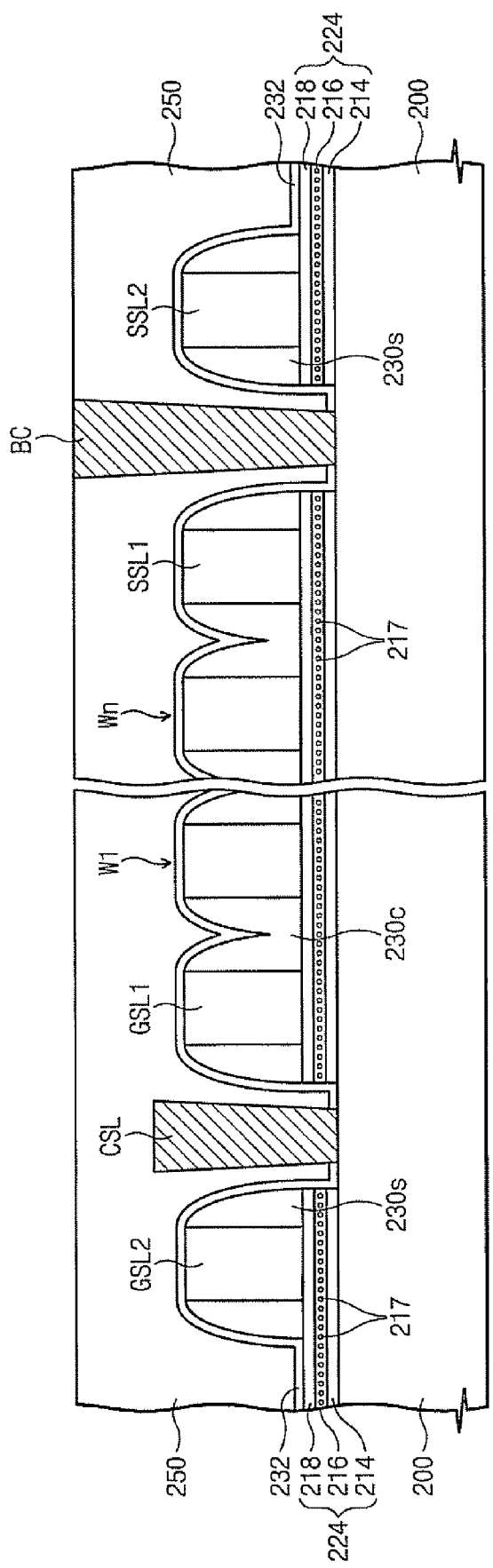

FIGS. 45A and 45B depict an exemplary embodiment of the present invention in which the charge storage layer 216 comprises an insulation layer that includes conductive dots.

As shown in FIG. 45A, the charge storage layer 216 includes a plurality of conductive dots 217. The conductive dots 217 constitute a plurality of charge storage sites, which are electrically insulated from each other, in the insulation layer. As shown in FIG. 45B, in this embodiment spacer insulation layers 230c and 230s may be disposed on sidewalls of the wordlines Wn, sidewalls of the ground select lines GSLn-1 and GSLn, and sidewalls of the string, select lines SSLn-1 and SSLn, and the charge storage layer 224 may be aligned with the spacer insulation layer 230s between the ground select lines and between string select lines to expose active regions as in the embodiments described above with respect to FIGS. 43A and 43B and FIGS. 44A and 44B.

Figure 46A:
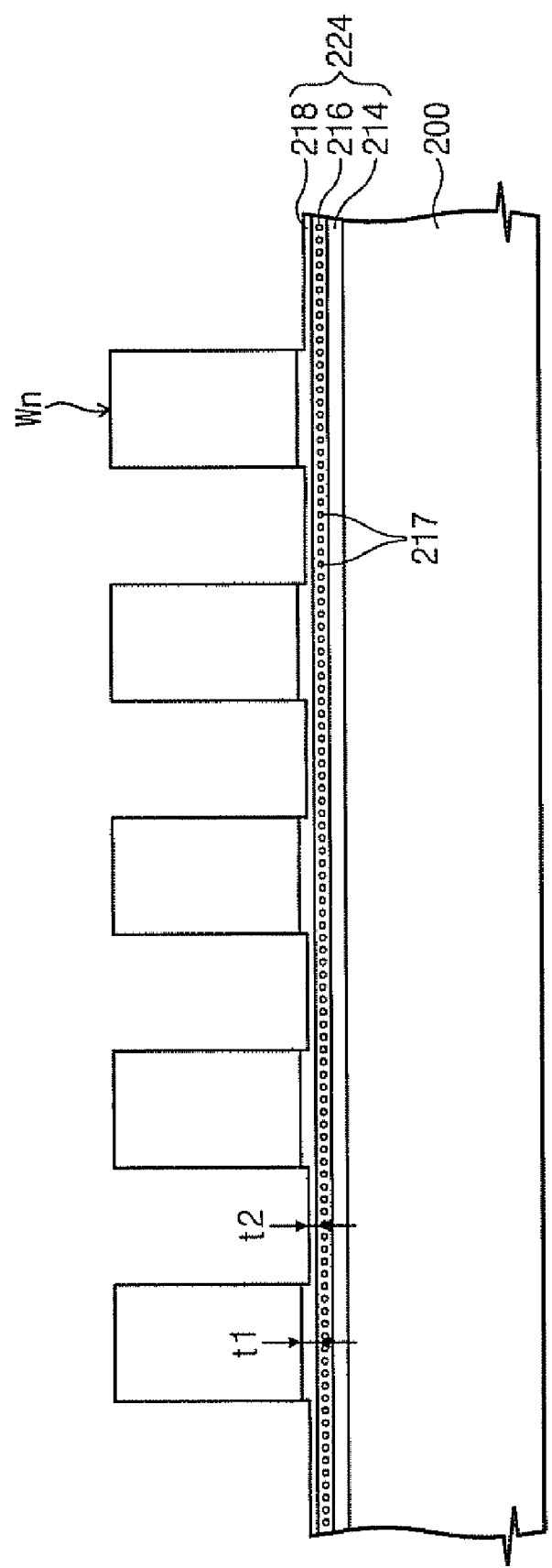
Figure 46B:
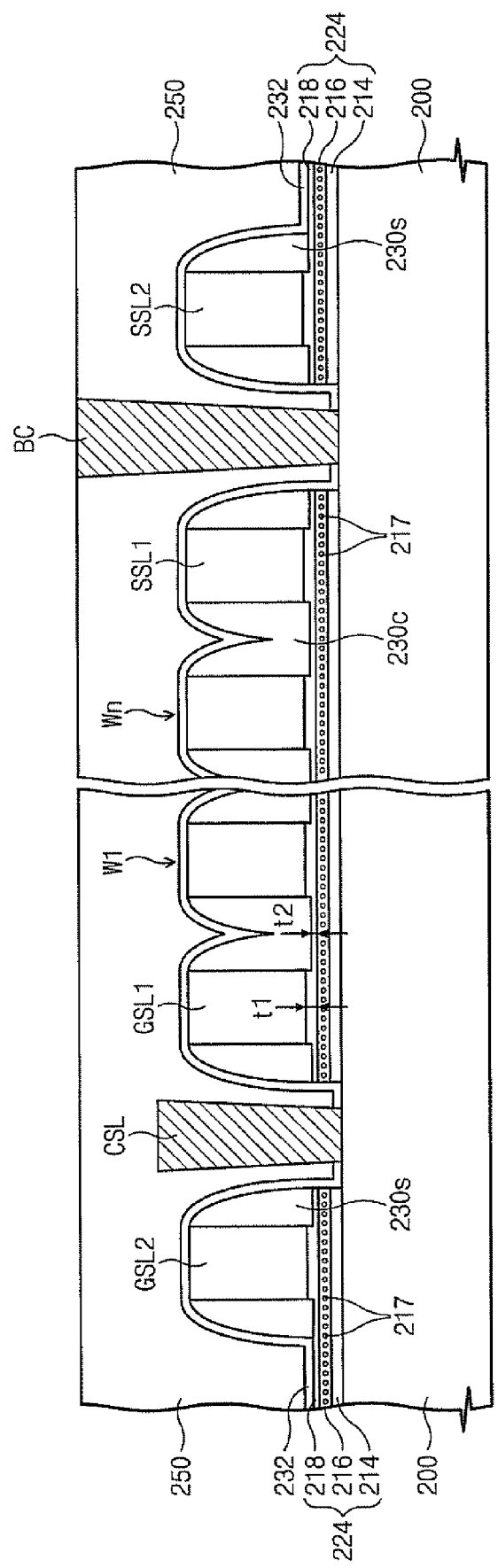
Figure 47A:
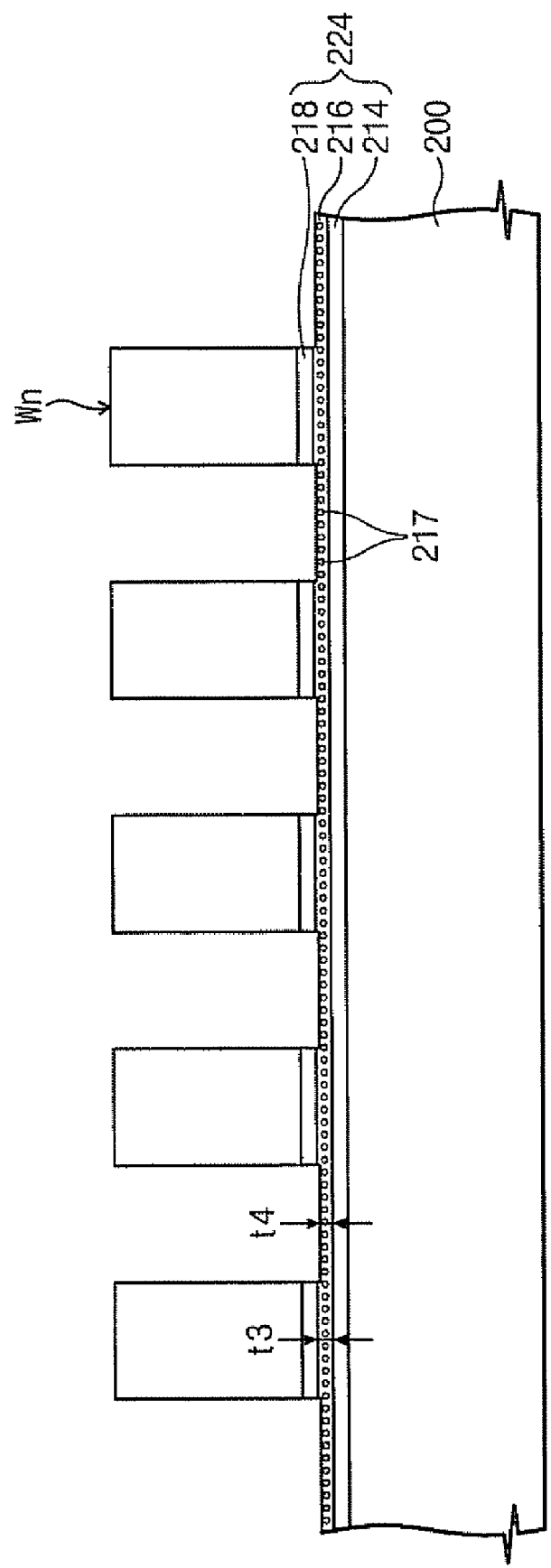
Figure 47B:
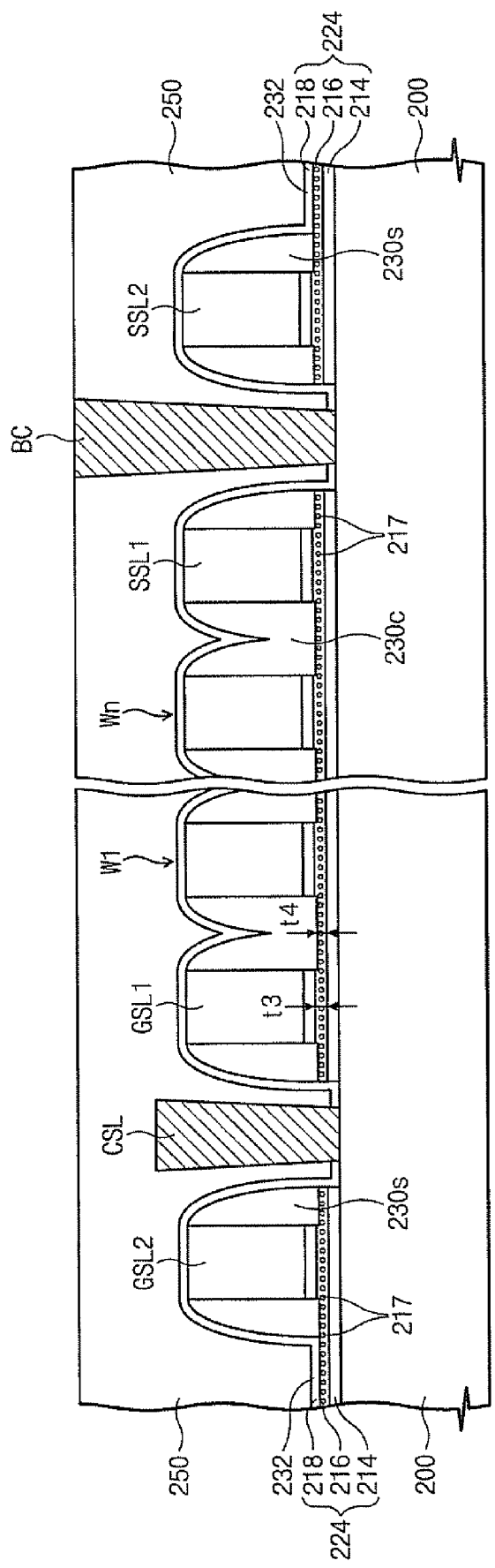

As illustrated in FIG. 46A, according to still further embodiments of the present invention the charge storage layer 216 may include conductive dots 217, and the upper insulation layer 218 may have recessed regions that are aligned with the sidewalls of respective of the wordlines Wn. In such embodiments, the thickness t2 of the upper insulation layer 218 in the regions between the wordlines Wn may be smaller than the thickness t1 of the upper insulation layer 218 in the regions below the wordlines Wn. In still other embodiments, the upper insulation layer 218 may be removed completely in the regions between adjacent wordlines Wn to expose the charge storage insulation layer 224. Further, as illustrated in FIG. 47A, the upper insulation layer 218, as well as a portion of the charge storage layer 216 (including conductive dots 217) may be removed in the regions between the wordlines Wn. A thickness t4 of the charge storage insulation layer 216 remaining in the regions between the wordlines may be smaller than a thickness t3 of the charge storage insulation layer 216 in the regions below the wordlines Wn. Also, as shown in FIGS. 46B and 47B, in these modified embodiments, spacer insulation layers 230c and 230s may be disposed on sidewalls of the wordlines Wn, of the ground select lines and of the string select lines, and the charge storage layer may be aligned with the spacer insulation layers 230s between the ground select lines and between the string select lines to expose active regions.

Figure 48:
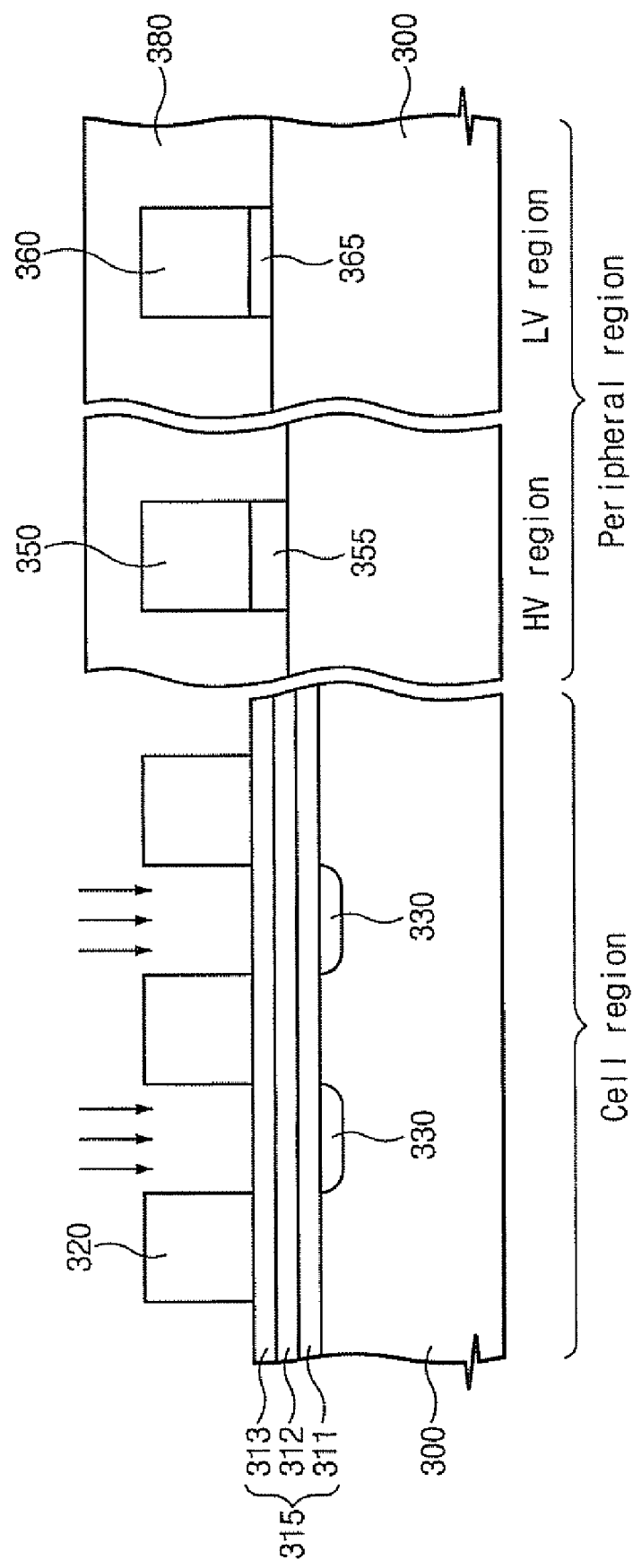
FIGS. 48 through 50 are cross-sectional views illustrating methods of fabricating non-volatile memory devices using ion implantation processes according to embodiments of the present invention.
Figure 49:
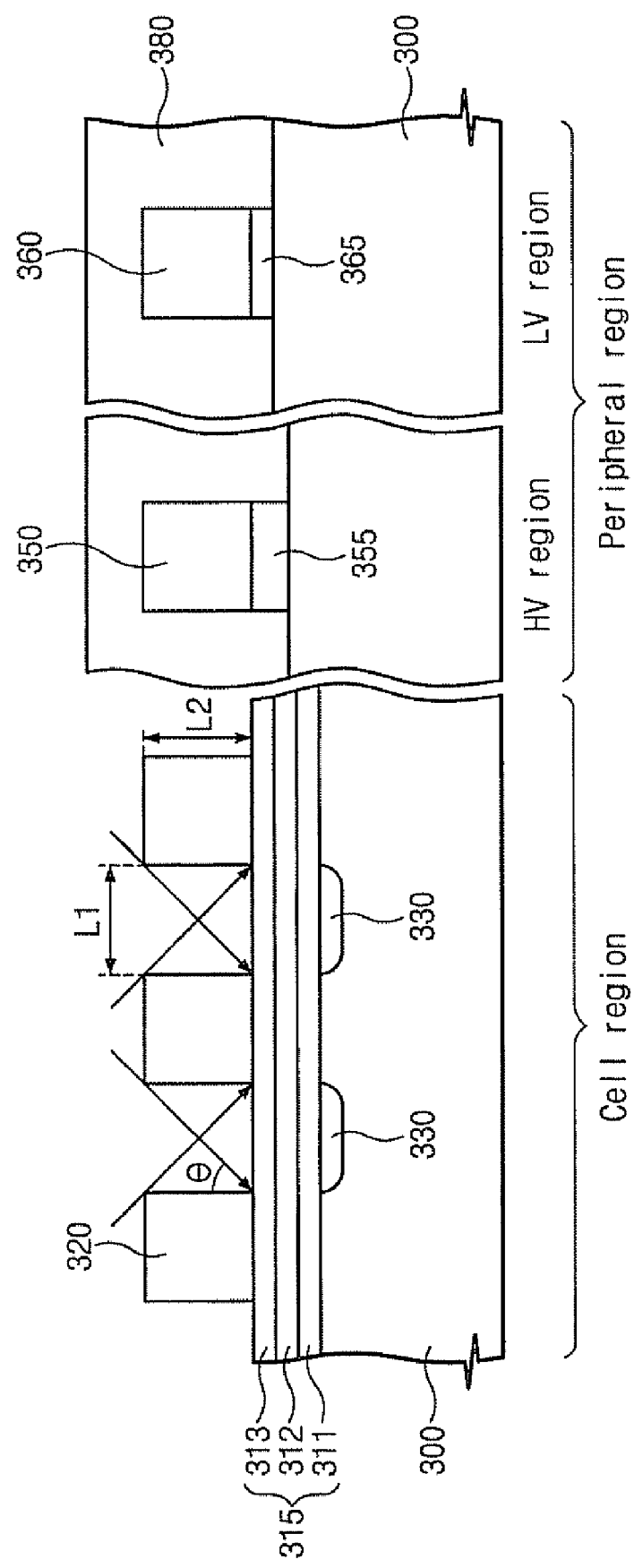
Figure 50:
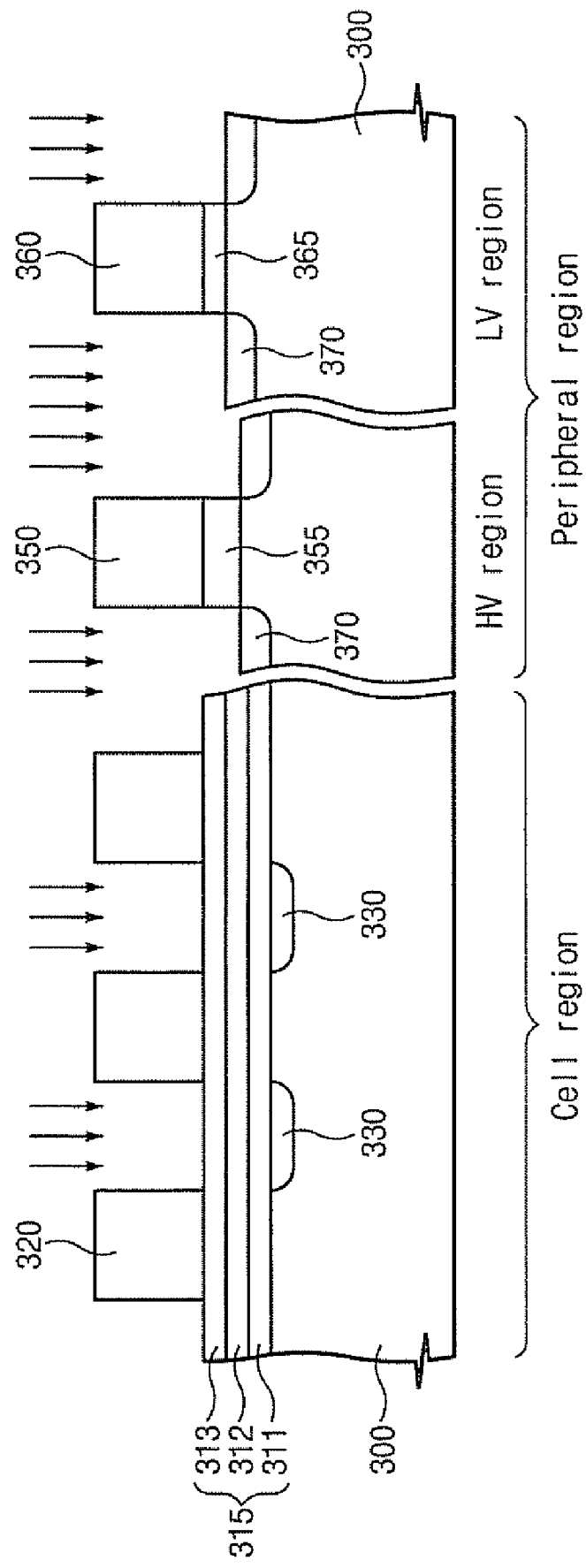

FIGS. 48 through 50 are cross-sectional views illustrating methods of fabricating non-volatile memory devices using an ion implantation process according to embodiments of the present invention. In these figures, "HV region" refers to the high voltage region of the device and is a cross-sectional view taken along the line E-E of FIG. 9 and "LV region" refers to the low voltage region of the device and is a cross-sectional view taken along the line F-F of FIG. 11. The "cell region" is a cross-sectional view taken along part of the line B-B of FIG. 6. The cross-section of the cell region has been simplified for ease of explanation.

As illustrated in FIG. 48, a non-volatile memory device according to embodiments of the present invention includes a cell region and a peripheral region. A plurality of device isolation layers (not shown in FIG. 48) are formed in a substrate 300 to define a plurality of first active regions in a cell region of the device, and a plurality of second active regions in a peripheral region of the device.

In the cell region, a charge storage insulation layer 315 is formed on at least the first active regions. The charge storage insulation layer 315 may comprise a lower insulation layer 311, a charge storage layer 312, and an upper insulation layer 313. A plurality of gate lines 320 are formed on the charge storage insulation layer 315.

The peripheral region may comprise a high voltage region and a low voltage region. A first gate electrode 350 is formed in the high voltage region, and a second gate electrode 360 is formed in the low voltage region. A first gate insulation layer 355 may be interposed between the first gate electrode 350 and the substrate 300, and a second gate insulation layer 365 may be interposed between the second gate electrode 360 and the substrate 300. The first gate electrode 350 may be a high voltage gate electrode, and the second gate electrode 360 may be a low voltage gate electrode.

An ion implantation mask 380 may be formed on the substrate 300 that exposes the cell region and covers the peripheral region. Subsequently, a first ion implantation process is carried out in the cell region whereby source/drain regions 330 may be formed in the active regions of the cell region.

The first ion implantation process may comprise a non-tilt ion implantation process and a tilt ion implantation process. Herein, a "non-tilt ion implantation process" refers to an ion implantation process wherein impurity ions are injected at an incident angle of about zero (0) degrees relative to a line that is orthogonal to the substrate. In the non-tilt ion implantation process, impurity ions such as P, As, $BF_2$, B, etc. may be injected with an energy of, for example, about 5~100 keV and a concentration of, for example, about 1E12~1E15 ions/cm$^2$.

FIG. 49 illustrates a tilt ion implantation process according to embodiments of the present invention. In some embodiments of the present invention, the tilt ion implantation process is carried out after the non-tilt ion implantation process. In other embodiments, the tilt ion implantation process is carried out prior to the non-tilt ion implantation process.

In the tilt ion implantation process, impurity ions are injected at an incident angle $\theta$ relative to a line that is orthogonal to the substrate. For example, where an interval between adjacent gate lines 320 is L1, and a height of the gate lines 320 from the charge storage insulation layer 315 is L2, impurity ions may be injected at an incident angle of about $\theta$ where $\theta$ is defined as $\theta \leq \tan^{-1}(L1/L2)$. Also, impurity ions may be injected in one direction or two directions. Unless there is the charge storage insulation layer 315 between the gate lines 320, a height of the gate lines 320 from the substrate 300 may be L2.

In the tilt ion implantation process, impurity ions such as P, As, $BF_2$, B, etc. may be injected with an energy of for example, about 5~100 keV and a concentration of for example, about 1E12~1E15 ions/cm$^2$.

As illustrated in FIGS. 48 and 49, the first ion implantation process may comprise both a non-tilt ion implantation process and a tilt ion implantation process. In other embodiments of the present invention, the first ion implantation process may comprise only one of the non-tilt ion implantation process and the tilt ion implantation process.

As illustrated in FIG. 50, a second ion implantation process is carried out after removing the ion implantation mask covering the peripheral region. Thereby, source/drain regions 370 are formed in the active regions of the peripheral region.

In the second ion implantation process, impurity ions such as P, As, $BF_2$, B, etc. may be injected with an energy of, for example, about 5~100 keV and a concentration of, for example, about 1E12~1E15 ions/cm$^2$. In the second ion implantation, impurity ions may be injected in both of the cell region and the peripheral region. According to embodiments of the present invention, as ion implantation processes are carried out more than twice in the cell region, the degree of freedom in source/drain regions of the cell region may increase. Also, a ion implantation mask covering the cell region may be omitted during the second ion implantation process. Thus, the ion implantation process may be simplified.

According to embodiments of the present invention, a charge storage insulator comprising a plurality of layers may be formed not only on the active region of the device, but also on the entire surface of the cell region. Alternatively, the charge storage insulator may cross over the active region and the device isolation layers along the gate patterns. In addition, the charge storage insulator may be formed after forming the device isolation layers so that stress applied to the charge storage insulator can be remarkably reduced. Moreover, the most upper layer of the charge storage insulator may be formed of a metal oxide to reduce defects by using the metal oxide layer as an etch stop layer, while contact holes or grooves are formed by patterning the interlayer dielectric layer.

While this invention has been particularly shown and described with reference to preferred embodiments thereof, it will be understood by those skilled in the art that various changes in form and details may be made therein without departing from the spirit and scope of the invention as defined by the appended claims and equivalents.

What is claimed is:

1. A method of fabricating a non-volatile memory device comprising:
   forming a plurality of device isolation layers in a cell region of a substrate to define a plurality of active regions, each of the plurality of device isolation layers having a top surface and opposed side surfaces, and the active regions being defined between the side surfaces of the device isolation layers;
   forming a charge storage insulator on the plurality of active regions and the plurality of device isolation layers, the charge storage insulator being formed to cover the top surfaces of the device isolation layers;
   forming a plurality of gate lines on the charge storage insulator that cross over the plurality of device isolation layers; and
   forming conductive patterns that penetrate the charge storage insulator between some of the plurality of gate lines to electrically connect with at least some of the plurality of active regions.

2. The method of claim 1, wherein the charge storage insulator is formed over substantially the entire surface of the cell region.

3. The method of claim 1, wherein forming a plurality of device isolation layers in the cell region comprises:
   forming a pad insulation layer and a hard mask layer on the substrate;
   patterning the hard mask layer, the pad insulation layer and the substrate to form a plurality of parallel trenches in the substrate in the cell region; and
   forming an insulation layer on the patterned hard mask layer, the patterned pad insulation layer and the patterned substrate to fill the plurality of parallel trenches.

4. The method of claim 3, further comprising:
   exposing the hard mask layer by polishing the insulation layers so as to divide the insulation layer into the plurality of device isolation layers.

5. The method of claim 4, further comprising removing the hard mask layer and the pad insulation layer after the plurality of device isolation layers are formed.

6. The method of claim 1, wherein forming the charge storage insulator comprises sequentially forming a lower oxide layer, a charge trapping layer and an upper oxide layer.

7. The method of claim 6, wherein the upper oxide layer is formed of insulative metal oxide layer.

8. The method of claim 1, wherein the device isolation layers are formed such that the top surfaces of the plurality of device isolation layers are disposed farther above the substrate than the top surfaces of the plurality of active regions.

9. The method of claim 1, further comprising forming a plurality of contact plugs that penetrate the charge storage insulator to electrically connect to the substrate.

10. A method of fabricating a non-volatile memory device comprising:
    forming a plurality of device isolation layers in a substrate to define a plurality of first active regions in a cell region of the device, a second active region in a high voltage region of the device and a third active region in a low voltage region of the device, each of the plurality of device isolation layers having a top surface and opposed side surfaces, and at least the first active regions being defined between the side surfaces of the device isolation layers in the cell region;
    forming a charge storage insulator on at least the first active regions and the device isolation layers in the cell region, the charge storage insulator being formed to cover the top surfaces of the device isolation layers in the cell region;
    forming a plurality of gate lines on the charge storage insulator;
    forming a first gate electrode over the second active region;
    forming a second gate electrode over the third active region;
    forming a first insulation layer on the second active region prior to forming the first gate electrode; and
    forming a second insulation layer on the third active region prior to forming the second gate electrode;
    wherein forming the first insulation layer comprises forming a first oxide layer on the second active region followed by forming a lower oxide layer on the first oxide layer; and
    wherein forming the second insulation layer comprises forming a second oxide layer that is thinner than the first oxide layer on the third active region followed by forming the lower oxide layer on the second oxide layer.

11. The method of claim 10, further comprising:
    forming conductive patterns that penetrate the charge storage insulator between some of the plurality of gate lines to electrically connect with at least some of the plurality of first active regions.

12. The method of claim 11, wherein the charge storage insulator is formed over substantially the entire surface of the cell region.

13. The method of claim 10, wherein forming a plurality of device isolation layers comprises:
    forming a pad insulation layer and a hard mask layer on the substrate;
    patterning the hard mask layer, the pad insulation layer and the substrate to form a plurality of trenches in the substrate; and
    forming the plurality of device isolation layers that fill in the plurality of trenches.

14. The method of claim 13, wherein forming the plurality of device isolation layers comprises forming an insulation layer over substantially the entire surface of at least the cell region and then exposing the hard mask layer by polishing the insulation layer so as to divide the insulation layer into the plurality of device isolation layers.

15. The method of claim 14, further comprising removing the hard mask layer and the pad insulation layer after the plurality of device isolation layers are formed.

16. The method of claim 10, wherein forming the charge storage insulator comprises sequentially stacking a lower oxide layer, a charge trapping layer and an upper oxide layer, and wherein the upper oxide layer is formed of insulative metal oxide layer.

17. The method of claim 10, wherein the device isolation layers are formed such that the top surfaces of the plurality of device isolation layers are disposed higher than the top surfaces of the plurality of first active regions.

18. A method of fabricating a non-volatile memory device, the method comprising:
   forming a plurality of device isolation layers in a substrate to define a plurality of active regions;
   forming a charge storage insulation layer on the plurality of active regions and the plurality of device isolation layers by sequentially forming a lower insulation layer, a charge storage layer and an upper insulation layer; and
   forming a plurality of spaced apart gate lines on the charge storage insulation layer, the plurality of spaced apart gate lines defining a plurality of regions between the gate lines,
   wherein the lower insulation layer and the charge storage layer cover the plurality of active regions and the plurality of device isolation layers in the plurality of regions between the gate lines.

19. The method of claim 18, wherein the charge storage layer is formed of an insulation layer or a silicon-rich oxide or an insulation layer that includes conductive dots.

20. The method of claim 18, wherein the upper insulation layer is formed such that the thickness of the upper insulation layer in the plurality of regions between the gate lines is smaller than the thickness of the upper insulation layer in a plurality of regions below the gate lines.

21. The method of claim 18, wherein forming the upper insulation layer includes forming at least one metal oxide layer.

22. The method of claim 21, wherein the metal oxide layer is formed of a metal listed in Group III or VB of the Periodic Table.

23. The method of claim 22, wherein forming the metal oxide layer includes doping the metal oxide layer with at least one element listed in Group IV of the Periodic Table.

24. The method of claim 23 wherein the metal oxide layer is formed of $Al_2O_3$, $HfO_2$, HfAlO, HfAlON, $ZrO_2$, ZrAlO, HfSiO, and/or HfSiON.

25. The method of claim 21, wherein forming the upper insulation layer further comprises forming a protective insulation layer on the at least one metal oxide layer prior to forming the gate lines.

26. A method of fabricating a non-volatile memory device, the method comprising:
   forming a plurality of device isolation layers in a substrate to define a plurality of active regions, each of the plurality of device isolation layers having a top surface and opposed side surfaces, and the active regions being defined between the side surfaces of the device isolation layers;
   forming a charge storage insulation layer on the plurality of active regions and the plurality of device isolation layers, the charge storage insulation layer being formed to cover the top surfaces of the device isolation layers;
   forming a plurality of spaced apart gate lines on the charge storage insulation layer, the plurality of spaced apart gate lines defining a plurality of regions between the gate lines, wherein a first subset of the regions between the gate lines have a first width and a second subset of the regions between the gate lines have a second width that is greater than the first width;
   forming spacer insulation layers on sidewalls of the gate lines that extend into respective of the regions between the gate lines;
   forming a plurality of interconnection patterns that are provided in respective ones of the second subset of the regions between the gate lines that electrically connect to the substrate;
   wherein each spacer insulation layer that extends into the first subset of the regions between the gate lines connects with another of the spacer insulation layers, while the spacer insulation layers that extend into the second subset of the regions between the gate lines are spaced apart from each other.

27. The method of claim 26, wherein the charge storage insulation layer is formed of an insulation layer or an insulation layer including silicon-rich oxide or an insulation layer including conductive dots.

28. The method of claim 26, wherein forming the charge storage insulation layer comprises sequentially forming a lower insulation layer, a charge storage layer and an upper insulation layer.

29. The method of claim 28, wherein the lower insulation layer and the charge storage layer cover the active region and the device isolation layer in the first subset of the regions between the gate lines.

30. The method of claim 28, wherein the upper insulation layer is formed such that a plurality of first portions of the upper insulation layer in the respective first subset of the regions between the gate lines are thinner than a plurality of second portions of the upper insulation layer that are below respective of the gate lines.

31. The method of claim 28, wherein forming the upper insulation layer includes forming at least one metal oxide layer.

32. The method of claim 31, wherein the metal oxide layer is formed of a metal listed in Group III or VB of the Periodic Table.

33. The method of claim 32, wherein forming the metal oxide layer includes doping the metal oxide layer with at least one element listed in Group IV of the Periodic Table.

34. The method of claim 33, wherein the metal oxide layer is formed of $Al_2O_3$, $HfO_2$, HfAlO, HfAlON, $ZrO_2$, ZrAlO, HfSiO, and/or HfSiON.

35. The method of claim 31, wherein forming the upper insulation layer further comprises forming a protective insulation layer on the at least one metal oxide layer prior to forming the gate lines.

36. The method of claim 26, further comprising patterning the charge storage insulation layer prior to forming the plurality of interconnection patterns such that edges of the charge storage insulation layer are aligned with respective of the spacer insulation layers that extend into the second subset of regions between adjacent of the gate lines.

37. A method of fabricating a non-volatile memory device, the method comprising:
   forming a plurality of device isolation layers in a substrate to define a plurality of active regions, each of the plurality of device isolation layers having a top surface and opposed side surfaces, and the active regions being defined between the side surfaces of the device isolation layers;
   forming a charge storage insulation layer on the plurality of active regions and the plurality of device isolation layers, the charge storage insulation layer being formed to cover the top surfaces of the device isolation layers;
   forming a plurality of spaced apart gate lines that include word lines, ground select lines and string select lines on the charge storage insulation layer; and forming sidewall spacers on sidewalls of the gate lines,
wherein each sidewall spacer on one of the word lines connects with the sidewall spacer on the gate line adjacent thereto.

38. The method of claim 37, wherein the sidewall spacers on facing sidewalls of adjacent ground select lines are spaced apart from each other, and wherein the sidewall spacers on facing sidewalls of adjacent string select lines are spaced apart from each other.

39. The method of claim 38, further comprising patterning the charge storage insulation layer such that edges of the charge storage insulation are aligned with the edges of the sidewall spacers in the areas between the adjacent string select lines and between the adjacent ground select lines.

40. The method of claim 37, wherein the upper insulation layer is formed such that regions of the upper insulation layer below the spaced apart gate lines are thicker than regions of the upper insulation layer between the spaced apart gate lines.

41. The method of claim 37, wherein forming the charge storage insulation layer comprises sequentially forming a lower insulation layer, a charge storage layer and an upper insulation layer.

42. The method of claim 41 wherein forming the plurality of spaced apart gate lines includes recessing the upper insulation layer in regions between the gate lines to expose the charge storage layer.

43. The method of claim 42, wherein forming the plurality of spaced apart gate lines includes recessing the charge storage layer such that regions of the charge storage layer between the gate lines are thinner than regions of the charge storage layer below the gate lines.

44. The method of claim 42, wherein the charge storage layer is formed of an insulation layer including conductive dots.

45. A method of fabricating a non-volatile memory device comprising:
forming a plurality of device isolation layers in a substrate to define a plurality of first active regions in a cell region of the device, and a plurality of second active regions in a peripheral region of the device, each of the plurality of device isolation layers having a top surface and opposed side surfaces, and at least the first active regions being defined between the side surfaces of the device isolation layers in the cell region;
forming a charge storage insulation layer on the first active regions, the charge storage insulation layer being formed to cover the top surfaces of the device isolation layers in the cell region;
forming a plurality of gate lines on the charge storage insulation layer;
forming a plurality of gate electrodes over the second active regions;
carrying out a first ion implantation process in the cell region; and
carrying out a second ion implantation process in the cell region and the peripheral region, wherein source/drain regions are formed in the cell region and the peripheral region by carrying out the first and second ion implantation processes.

46. The method of claim 45, further comprising forming an ion implantation mask on the substrate that exposes at least portions of the cell region and covers the peripheral region before carrying out the first ion implantation process; and
removing the ion implantation mask after carrying our the first ion implantation process and before carrying out the second ion implantation process.

47. The method of claim 45, wherein the first ion implantation process comprises a tilt ion implantation process.

48. The method of claim 47, wherein the first ion implantation process further comprises a non-tilt ion implantation process.

49. The method of claim 48, wherein the non-tilt ion implantation process is carried out prior to the tilt ion implantation process.

50. The method of claim 47, wherein the tilt ion implantation process is carried out prior to the non-tilt ion implantation process.

51. The method of claim 47, wherein
an interval between adjacent gate lines is L1;
a height of the gate lines from the charge storage insulation layer is L2; and
impurity ions are injected at an incident angle that is less than or about equal to $\tan^{-1}(L1/L2)$.

* * * * *